(12) United States Patent
Araki

(10) Patent No.: US 11,107,974 B2
(45) Date of Patent: *Aug. 31, 2021

(54) MAGNETIC TUNNEL JUNCTION DEVICES INCLUDING A FREE MAGNETIC TRENCH LAYER AND A PLANAR REFERENCE MAGNETIC LAYER

(71) Applicant: SPIN MEMORY, Inc., Fremont, CA (US)

(72) Inventor: Satoru Araki, San Jose, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/121,453

(22) Filed: Sep. 4, 2018

(65) Prior Publication Data

US 2019/0296224 A1 Sep. 26, 2019

Related U.S. Application Data

(63) Continuation-in-part of application No. 16/059,012, filed on Aug. 8, 2018, now Pat. No. 10,734,573, and (Continued)

(51) Int. Cl.
*H01L 43/02* (2006.01)
*H01L 43/08* (2006.01)
(Continued)

(52) U.S. Cl.
CPC ............ *H01L 43/02* (2013.01); *G11C 11/161* (2013.01); *G11C 11/1659* (2013.01); (Continued)

(58) Field of Classification Search
CPC ......... H01L 27/222–228; H01L 27/101; H01L 27/2481; H01L 27/249; H01L 43/02; (Continued)

(56) References Cited

U.S. PATENT DOCUMENTS

| 4,597,487 A | 7/1986 | Crosby et al. |
| 5,541,868 A | 7/1996 | Prinz |

(Continued)

FOREIGN PATENT DOCUMENTS

| CN | 105706259 | 6/2016 |
| FR | 2910716 | 6/2008 |

(Continued)

OTHER PUBLICATIONS

US 7,026,672 B2, 04/2006, Grandis (withdrawn)

(Continued)

*Primary Examiner* — Yu Chen

(57) ABSTRACT

A Magnetic Tunnel Junction (MTJ) device can include a reference magnetic layer having one or more trenches disposed therein. One or more sections of a tunnel barrier layer can be disposed on the walls of the one or more trenches. One or more sections of a free magnetic layer can be disposed on the one or more sections of the tunnel barrier layer in the one or more trenches. One or more sections of a conductive layer can be disposed on the one or more sections of the free magnetic layer in the one or more trenches. One or more insulator blocks can be disposed between corresponding sections of the tunnel barrier layer, corresponding sections of the free magnetic layer and corresponding sections of the conductive layer in the one or more trenches.

27 Claims, 25 Drawing Sheets

Related U.S. Application Data a continuation-in-part of application No. 16/059,018, filed on Aug. 8, 2018, and a continuation-in-part of application No. 16/059,009, filed on Aug. 8, 2018, and a continuation-in-part of application No. 16/059,004, filed on Aug. 8, 2018, and a continuation-in-part of application No. 16/059,016, filed on Aug. 8, 2018, now Pat. No. 10,529,915.

(60) Provisional application No. 62/647,210, filed on Mar. 23, 2018.

(51) Int. Cl.
| | |
|---|---|
| *H01F 10/32* | (2006.01) |
| *G11C 11/16* | (2006.01) |
| *H01L 43/12* | (2006.01) |
| *H01L 43/10* | (2006.01) |
| *H01L 27/22* | (2006.01) |
| *H01L 21/822* | (2006.01) |

(52) U.S. Cl.
CPC ....... *H01F 10/329* (2013.01); *H01F 10/3259* (2013.01); *H01L 21/8221* (2013.01); *H01L 27/228* (2013.01); *H01L 43/08* (2013.01); *H01L 43/10* (2013.01); *H01L 43/12* (2013.01); *G11C 11/1657* (2013.01); *G11C 11/1673* (2013.01); *H01F 10/3286* (2013.01)

(58) Field of Classification Search
CPC . H01L 43/08; H01L 25/0657; H01L 21/8221; H01L 45/1226; H01L 43/12; G11C 11/155; G11C 11/161; G11C 2211/5615; H01F 10/3259; H01F 10/329
See application file for complete search history.

(56) References Cited

U.S. PATENT DOCUMENTS

| | | | |
|---|---|---|---|
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,635,367 B2 | 10/2003 | Igarashi et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,807,091 B2 | 10/2004 | Saito |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,842,366 B2 | 1/2005 | Chan |
| 6,847,547 B2 | 1/2005 | Albert et al. |
| 6,879,512 B2 | 4/2005 | Luo |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,938,142 B2 | 8/2005 | Pawlowski |
| 6,956,257 B2 | 10/2005 | Zhu et al. |
| 6,958,507 B2 | 10/2005 | Atwood et al. |
| 6,958,927 B1 | 10/2005 | Nguyen et al. |
| 6,967,863 B2 | 11/2005 | Huai |
| 6,980,469 B2 | 12/2005 | Kent et al. |
| 6,984,529 B2 | 1/2006 | Stojakovic et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,033,126 B2 | 4/2006 | Van Den Berg |
| 7,041,598 B2 | 5/2006 | Sharma |
| 7,045,368 B2 | 5/2006 | Hong et al. |
| 7,054,119 B2 | 5/2006 | Sharma et al. |
| 7,057,922 B2 | 6/2006 | Fukumoto |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,149,106 B2 | 12/2006 | Mancoff et al. |
| 7,161,829 B2 | 1/2007 | Huai et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,203,802 B2 | 4/2007 | Huras |
| 7,227,773 B1 | 6/2007 | Nguyen et al. |
| 7,233,039 B2 | 6/2007 | Huai et al. |
| 7,242,045 B2 | 7/2007 | Nguyen et al. |

(56) References Cited

U.S. PATENT DOCUMENTS

| | | |
|---|---|---|
| 7,245,462 B2 | 7/2007 | Huai et al. |
| 7,262,941 B2 | 8/2007 | Li et al. |
| 7,273,780 B2 | 9/2007 | Kim |
| 7,283,333 B2 | 10/2007 | Gill |
| 7,307,876 B2 | 12/2007 | Kent et al. |
| 7,313,015 B2 | 12/2007 | Bessho |
| 7,324,387 B1 | 1/2008 | Bergemont et al. |
| 7,324,389 B2 | 1/2008 | Cernea |
| 7,335,960 B2 | 2/2008 | Han et al. |
| 7,351,594 B2 | 4/2008 | Bae et al. |
| 7,352,021 B2 | 4/2008 | Bae et al. |
| 7,369,427 B2 | 5/2008 | Diao et al. |
| 7,372,722 B2 | 5/2008 | Jeong |
| 7,376,006 B2 | 5/2008 | Bednorz et al. |
| 7,386,765 B2 | 6/2008 | Ellis |
| 7,404,017 B2 | 7/2008 | Kuo |
| 7,421,535 B2 | 9/2008 | Jarvis et al. |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Guo |
| 7,511,985 B2 | 3/2009 | Horii |
| 7,515,458 B2 | 4/2009 | Hung et al. |
| 7,515,485 B2 | 4/2009 | Lee |
| 7,532,503 B2 | 5/2009 | Morise et al. |
| 7,541,117 B2 | 6/2009 | Ogawa |
| 7,542,326 B2 | 6/2009 | Yoshimura |
| 7,573,737 B2 | 8/2009 | Kent et al. |
| 7,576,956 B2 | 8/2009 | Huai |
| 7,582,166 B2 | 9/2009 | Lampe |
| 7,598,555 B1 | 10/2009 | Papworth-Parkin |
| 7,602,000 B2 | 10/2009 | Sun et al. |
| 7,619,431 B2 | 11/2009 | DeWilde et al. |
| 7,633,800 B2 | 12/2009 | Adusumilli et al. |
| 7,642,612 B2 | 1/2010 | Izumi et al. |
| 7,660,161 B2 | 2/2010 | Van Tran |
| 7,663,171 B2 | 2/2010 | Inokuchi et al. |
| 7,675,792 B2 | 3/2010 | Bedeschi |
| 7,696,551 B2 | 4/2010 | Xiao |
| 7,733,699 B2 | 6/2010 | Roohparvar |
| 7,739,559 B2 | 6/2010 | Suzuki et al. |
| 7,773,439 B2 | 8/2010 | Do et al. |
| 7,776,665 B2 | 8/2010 | Izumi et al. |
| 7,796,439 B2 | 9/2010 | Arai |
| 7,810,017 B2 | 10/2010 | Radke |
| 7,821,818 B2 | 10/2010 | Dieny et al. |
| 7,852,662 B2 | 12/2010 | Yang |
| 7,861,141 B2 | 12/2010 | Chen |
| 7,881,095 B2 | 2/2011 | Lu |
| 7,911,832 B2 | 3/2011 | Kent et al. |
| 7,916,515 B2 | 3/2011 | Li |
| 7,936,595 B2 | 5/2011 | Han et al. |
| 7,936,598 B2 | 5/2011 | Zheng et al. |
| 7,983,077 B2 | 7/2011 | Park |
| 7,986,544 B2 | 7/2011 | Kent et al. |
| 8,008,095 B2 | 8/2011 | Assefa et al. |
| 8,028,119 B2 | 9/2011 | Miura |
| 8,041,879 B2 | 10/2011 | Erez |
| 8,055,957 B2 | 11/2011 | Kondo |
| 8,058,925 B2 | 11/2011 | Rasmussen |
| 8,059,460 B2 | 11/2011 | Jeong et al. |
| 8,072,821 B2 | 12/2011 | Arai |
| 8,077,496 B2 | 12/2011 | Choi |
| 8,080,365 B2 | 12/2011 | Nozaki |
| 8,088,556 B2 | 1/2012 | Nozaki |
| 8,094,480 B2 | 1/2012 | Tonomura |
| 8,102,701 B2 | 1/2012 | Prejbeanu et al. |
| 8,105,948 B2 | 1/2012 | Zhong et al. |
| 8,120,949 B2 | 2/2012 | Ranjan et al. |
| 8,143,683 B2 | 3/2012 | Wang et al. |
| 8,144,509 B2 | 3/2012 | Jung |
| 8,148,970 B2 | 4/2012 | Fuse |
| 8,159,867 B2 | 4/2012 | Cho et al. |
| 8,201,024 B2 | 6/2012 | Burger |
| 8,223,534 B2 | 7/2012 | Chung |
| 8,255,742 B2 | 8/2012 | Ipek |
| 8,278,996 B2 | 10/2012 | Miki |
| 8,279,666 B2 | 10/2012 | Dieny et al. |
| 8,295,073 B2 | 10/2012 | Norman |
| 8,295,082 B2 | 10/2012 | Chua-Eoan |
| 8,334,213 B2 | 12/2012 | Mao |
| 8,345,474 B2 | 1/2013 | Oh |
| 8,349,536 B2 | 1/2013 | Nozaki |
| 8,362,580 B2 | 1/2013 | Chen et al. |
| 8,363,465 B2 | 1/2013 | Kent et al. |
| 8,374,050 B2 | 2/2013 | Zhou et al. |
| 8,386,836 B2 | 2/2013 | Burger |
| 8,415,650 B2 | 4/2013 | Greene |
| 8,416,620 B2 | 4/2013 | Zheng et al. |
| 8,422,286 B2 | 4/2013 | Ranjan et al. |
| 8,422,330 B2 | 4/2013 | Hatano et al. |
| 8,432,727 B2 | 4/2013 | Ryu |
| 8,441,844 B2 | 5/2013 | El Baraji |
| 8,456,383 B2 | 6/2013 | Liu |
| 8,456,926 B2 | 6/2013 | Ong et al. |
| 8,477,530 B2 | 7/2013 | Ranjan et al. |
| 8,492,881 B2 | 7/2013 | Kuroiwa et al. |
| 8,495,432 B2 | 7/2013 | Dickens |
| 8,535,952 B2 | 9/2013 | Ranjan et al. |
| 8,539,303 B2 | 9/2013 | Lu |
| 8,542,524 B2 | 9/2013 | Keshtbod et al. |
| 8,549,303 B2 | 10/2013 | Fifield et al. |
| 8,558,334 B2 | 10/2013 | Ueki et al. |
| 8,559,215 B2 | 10/2013 | Zhou et al. |
| 8,574,928 B2 | 11/2013 | Satoh et al. |
| 8,582,353 B2 | 11/2013 | Lee |
| 8,590,139 B2 | 11/2013 | Op DeBeeck et al. |
| 8,592,927 B2 | 11/2013 | Jan |
| 8,593,868 B2 | 11/2013 | Park |
| 8,609,439 B2 | 12/2013 | Prejbeanu et al. |
| 8,617,408 B2 | 12/2013 | Balamane |
| 8,625,339 B2 | 1/2014 | Ong |
| 8,634,232 B2 | 1/2014 | Oh |
| 8,667,331 B2 | 3/2014 | Hori |
| 8,687,415 B2 | 4/2014 | Parkin et al. |
| 8,705,279 B2 | 4/2014 | Kim |
| 8,716,817 B2 | 5/2014 | Saida |
| 8,716,818 B2 | 5/2014 | Yoshikawa et al. |
| 8,722,543 B2 | 5/2014 | Belen |
| 8,737,137 B1 | 5/2014 | Choy et al. |
| 8,755,222 B2 | 6/2014 | Kent et al. |
| 8,779,410 B2 | 7/2014 | Sato et al. |
| 8,780,617 B2 | 7/2014 | Kang |
| 8,792,269 B1 | 7/2014 | Abedifard |
| 8,802,451 B2 | 8/2014 | Malmhall |
| 8,810,974 B2 | 8/2014 | Noel et al. |
| 8,817,525 B2 | 8/2014 | Ishihara |
| 8,832,530 B2 | 9/2014 | Pangal et al. |
| 8,852,760 B2 | 10/2014 | Wang et al. |
| 8,853,807 B2 | 10/2014 | Son et al. |
| 8,860,156 B2 | 10/2014 | Beach et al. |
| 8,862,808 B2 | 10/2014 | Tsukamoto et al. |
| 8,867,258 B2 | 10/2014 | Rao |
| 8,883,520 B2 | 11/2014 | Satoh et al. |
| 8,902,628 B2 | 12/2014 | Ha |
| 8,966,345 B2 | 2/2015 | Wilkerson |
| 8,987,849 B2 | 3/2015 | Jan |
| 9,019,754 B1 | 4/2015 | Bedeschi |
| 9,025,378 B2 | 5/2015 | Tokiwa |
| 9,026,888 B2 | 5/2015 | Kwok |
| 9,030,899 B2 | 5/2015 | Lee |
| 9,036,407 B2 | 5/2015 | Wang et al. |
| 9,037,812 B2 | 5/2015 | Chew |
| 9,043,674 B2 | 5/2015 | Wu |
| 9,070,441 B2 | 6/2015 | Otsuka et al. |
| 9,070,855 B2 | 6/2015 | Gan et al. |
| 9,076,530 B2 | 7/2015 | Gomez et al. |
| 9,082,888 B2 | 7/2015 | Kent et al. |
| 9,104,581 B2 | 8/2015 | Fee et al. |
| 9,104,595 B2 | 8/2015 | Sah |
| 9,130,155 B2 | 9/2015 | Chepulskyy et al. |

(56) References Cited

U.S. PATENT DOCUMENTS

| | | |
|---|---|---|
| 9,136,463 B2 | 9/2015 | Li |
| 9,140,747 B2 | 9/2015 | Kim |
| 9,165,629 B2 | 10/2015 | Chih |
| 9,165,787 B2 | 10/2015 | Kang |
| 9,166,155 B2 | 10/2015 | Deshpande |
| 9,178,958 B2 | 11/2015 | Lindamood |
| 9,189,326 B2 | 11/2015 | Kalamatianos |
| 9,190,471 B2 | 11/2015 | Yi et al. |
| 9,196,332 B2 | 11/2015 | Zhang et al. |
| 9,229,806 B2 | 1/2016 | Mekhanik et al. |
| 9,229,853 B2 | 1/2016 | Khan |
| 9,231,191 B2 | 1/2016 | Huang et al. |
| 9,245,608 B2 | 1/2016 | Chen et al. |
| 9,250,990 B2 | 2/2016 | Motwani |
| 9,250,997 B2 | 2/2016 | Kim et al. |
| 9,251,896 B2 | 2/2016 | Ikeda |
| 9,257,483 B2 | 2/2016 | Ishigaki |
| 9,263,667 B1 | 2/2016 | Pinarbasi |
| 9,286,186 B2 | 3/2016 | Weiss |
| 9,298,552 B2 | 3/2016 | Leem |
| 9,299,412 B2 | 3/2016 | Naeimi |
| 9,317,429 B2 | 4/2016 | Ramanujan |
| 9,324,457 B2 | 4/2016 | Takizawa |
| 9,337,412 B2 | 5/2016 | Pinarbasi et al. |
| 9,341,939 B1 | 5/2016 | Yu et al. |
| 9,342,403 B2 | 5/2016 | Keppel et al. |
| 9,349,482 B2 | 5/2016 | Kim et al. |
| 9,351,899 B2 | 5/2016 | Bose et al. |
| 9,362,486 B2 | 6/2016 | Kim et al. |
| 9,378,817 B2 | 6/2016 | Kawai |
| 9,379,314 B2 | 6/2016 | Park et al. |
| 9,389,954 B2 | 7/2016 | Pelley et al. |
| 9,396,065 B2 | 7/2016 | Webb et al. |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose |
| 9,431,084 B2 | 8/2016 | Bose et al. |
| 9,449,720 B1 | 9/2016 | Lung |
| 9,450,180 B1 | 9/2016 | Annunziata |
| 9,455,013 B2 | 9/2016 | Kim |
| 9,466,789 B2 | 10/2016 | Wang et al. |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,520,128 B2 | 12/2016 | Bauer et al. |
| 9,520,192 B2 | 12/2016 | Naeimi et al. |
| 9,525,126 B1 * | 12/2016 | Lin .................. H01L 43/12 |
| 9,548,116 B2 | 1/2017 | Roy |
| 9,548,445 B2 | 1/2017 | Lee et al. |
| 9,553,102 B2 | 1/2017 | Wang |
| 9,564,587 B1 * | 2/2017 | Jo .................. G11C 13/0004 |
| 9,583,167 B2 | 2/2017 | Chung |
| 9,594,683 B2 | 3/2017 | Dittrich |
| 9,600,183 B2 | 3/2017 | Tomishima et al. |
| 9,608,038 B2 | 3/2017 | Wang et al. |
| 9,634,237 B2 | 4/2017 | Lee et al. |
| 9,640,267 B2 | 5/2017 | Tani |
| 9,646,701 B2 | 5/2017 | Lee |
| 9,652,321 B2 | 5/2017 | Motwani |
| 9,662,925 B2 | 5/2017 | Raksha et al. |
| 9,697,140 B2 | 7/2017 | Kwok |
| 9,720,616 B2 | 8/2017 | Yu |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,780,300 B2 | 10/2017 | Zhou et al. |
| 9,793,319 B2 | 10/2017 | Gan et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,858,976 B2 | 1/2018 | Ikegami |
| 9,859,333 B2 | 1/2018 | Kim et al. |
| 9,865,806 B2 | 1/2018 | Choi et al. |
| 9,935,258 B2 | 4/2018 | Chen et al. |
| 10,008,662 B2 | 6/2018 | You |
| 10,026,609 B2 | 7/2018 | Sreenivasan et al. |
| 10,038,137 B2 | 7/2018 | Chuang |
| 10,042,588 B2 | 8/2018 | Kang |
| 10,043,851 B1 | 8/2018 | Shen |
| 10,043,967 B2 | 8/2018 | Chen |
| 10,062,837 B2 | 8/2018 | Kim et al. |
| 10,115,446 B1 | 10/2018 | Louie et al. |
| 10,134,988 B2 | 11/2018 | Fennimore et al. |
| 10,163,479 B2 | 12/2018 | Berger et al. |
| 10,186,614 B2 | 1/2019 | Asami |
| 2002/0090533 A1 | 7/2002 | Zhang et al. |
| 2002/0105823 A1 | 8/2002 | Redon et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0018057 A1 | 1/2006 | Huai |
| 2006/0033136 A1 * | 2/2006 | Liu .................. H01L 43/08 257/296 |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0096229 A1 | 5/2007 | Yoshikawa |
| 2007/0242501 A1 | 10/2007 | Hung et al. |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0151614 A1 | 6/2008 | Guo |
| 2008/0259508 A2 | 10/2008 | Kent et al. |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny et al. |
| 2010/0124091 A1 | 5/2010 | Cowburn |
| 2010/0162065 A1 | 6/2010 | Norman |
| 2010/0193891 A1 | 8/2010 | Wang et al. |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0089511 A1 | 4/2011 | Keshtbod et al. |
| 2011/0133298 A1 | 6/2011 | Chen et al. |
| 2012/0052258 A1 | 3/2012 | Op DeBeeck et al. |

(56) References Cited

U.S. PATENT DOCUMENTS

| | | |
|---|---|---|
| 2012/0069649 A1 | 3/2012 | Ranjan et al. |
| 2012/0155156 A1 | 6/2012 | Watts |
| 2012/0155158 A1 | 6/2012 | Higo |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0244344 A1 | 9/2013 | Malmhall et al. |
| 2013/0267042 A1 | 10/2013 | Satoh et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0070341 A1 | 3/2014 | Beach et al. |
| 2014/0103472 A1 | 4/2014 | Kent et al. |
| 2014/0136870 A1 | 5/2014 | Breternitz et al. |
| 2014/0151837 A1 | 6/2014 | Ryu |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0264671 A1 | 9/2014 | Chepulskyy et al. |
| 2014/0281284 A1 | 9/2014 | Block et al. |
| 2014/0306302 A1* | 10/2014 | Jan ................ H01L 43/10 257/421 |
| 2015/0056368 A1 | 2/2015 | Wang et al. |
| 2015/0279904 A1 | 10/2015 | Pinarbasi et al. |
| 2016/0064452 A1* | 3/2016 | Ueda ................ H01L 27/228 365/148 |
| 2016/0087193 A1 | 3/2016 | Pinarbasi et al. |
| 2016/0163973 A1 | 6/2016 | Pinarbasi |
| 2016/0218278 A1 | 7/2016 | Pinarbasi et al. |
| 2016/0283385 A1 | 9/2016 | Boyd et al. |
| 2016/0315118 A1 | 10/2016 | Kardasz et al. |
| 2016/0378592 A1 | 12/2016 | Ikegami et al. |
| 2017/0062712 A1 | 3/2017 | Choi et al. |
| 2017/0123991 A1 | 5/2017 | Sela et al. |
| 2017/0133104 A1 | 5/2017 | Darbari et al. |
| 2017/0141157 A1* | 5/2017 | Sakai ................ H01L 27/226 |
| 2017/0199459 A1 | 7/2017 | Ryu et al. |
| 2018/0033957 A1 | 2/2018 | Zhang |
| 2018/0097006 A1 | 4/2018 | Kim et al. |
| 2018/0114589 A1 | 4/2018 | El-Baraji et al. |
| 2018/0119278 A1 | 5/2018 | Kornmeyer |
| 2018/0121117 A1 | 5/2018 | Berger et al. |
| 2018/0121355 A1 | 5/2018 | Berger et al. |
| 2018/0121361 A1 | 5/2018 | Berger et al. |
| 2018/0122446 A1 | 5/2018 | Berger et al. |
| 2018/0122447 A1 | 5/2018 | Berger et al. |
| 2018/0122448 A1 | 5/2018 | Berger et al. |
| 2018/0122449 A1 | 5/2018 | Berger et al. |
| 2018/0122450 A1 | 5/2018 | Berger et al. |
| 2018/0130945 A1 | 5/2018 | Choi et al. |
| 2018/0211821 A1 | 7/2018 | Kogler |
| 2018/0233362 A1 | 8/2018 | Glodde |
| 2018/0233363 A1 | 8/2018 | Glodde |
| 2018/0248110 A1 | 8/2018 | Kardasz et al. |
| 2018/0248113 A1 | 8/2018 | Pinarbasi et al. |
| 2018/0331279 A1 | 11/2018 | Shen |

FOREIGN PATENT DOCUMENTS

| | | |
|---|---|---|
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273 A1, 06/2016, Pinarbasi (withdrawn)

Bhatti Sabpreet et al., "Spintronics Based Random Access Memory: a Review," Material Today, Nov. 2107, pp. 530-548, vol. 20, No. 9, Elsevier.

Helia Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFeB—MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).

K.J. Lee, et al., "Analytical Investigation of Spin-Transfer Dynamics Using a Perpendicular-to-Plane Polarizer", Applied Physics Letters, American Insitute of Physics, vol. 86, (2005), pp. 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscroolc Ferromagnetic Rings", NSF grants PHY-0351964 (DLS), 2006, 23 pages.

"Magnetic: Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

\* cited by examiner

MAGNETIC TUNNEL JUNCTION DEVICES INCLUDING A FREE MAGNETIC TRENCH LAYER AND A PLANAR REFERENCE MAGNETIC LAYER

CROSS-REFERENCE TO RELATED APPLICATIONS

This is a continuation-in-part of U.S. patent application Ser. No. 16/059,004 filed Aug. 8, 2018, U.S. patent application Ser. No. 16/059,009 filed Aug. 8, 2018, U.S. patent application Ser. No. 16/059,012 filed Aug. 8, 2018, U.S. patent application Ser. No. 16/059,016 filed Aug. 8, 2018, U.S. patent application Ser. No. 16/059,018 filed Aug. 8, 2018; and claims the benefit of U.S. Provisional Patent Application No. 62/647,210 filed Mar. 23, 2018; all of which are incorporated herein in their entirety.

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, game consoles, servers, distributed computing systems, Internet of Things (IoT) devices, Artificial Intelligence (AI), and the like have facilitated increased productivity and reduced costs in communicating and analyzing data in most areas of entertainment, education, business, and science. One common aspect of computing systems is the computing device readable memory. Computing devices may include one or more types of memory, such as volatile random-access memory, non-volatile flash memory, and the like.

An emerging non-volatile memory technology is Magnetoresistive Random Access Memory (MRAM). In MRAM devices, data can be stored in the magnetization orientation between ferromagnetic layers of a Magnetic Tunnel Junction (MTJ). Referring to FIG. 1, a MTJ, in accordance with the convention art, is shown. The MTJ can include two magnetic layers 110, 120, and a magnetic tunnel barrier layer 130. One of the magnetic layers 110 can have a fixed magnetization polarization 140, while the polarization of the magnetization of the other magnetic layer 120 can switch between opposite directions. Typically, if the magnetic layers 110, 120 have the same magnetization polarization, the MTJ cell will exhibit a relatively low resistance value corresponding to a '1' bit state; while if the magnetization polarization between the two magnetic layers 110, 120 is antiparallel the MTJ cell will exhibit a relatively high resistance value corresponding to a '0' bit state. Because the data is stored in the magnetic fields, MRAM devices are non-volatile memory devices. The state of a MRAM cell can be read by applying a predetermined current through the cell and measuring the resulting voltage, or by applying a predetermined voltage across the cell and measuring the resulting current. The sensed current or voltage is proportional to the resistance of the cell and can be compared to a reference value to determine the state of the cell.

MRAM devices are characterized by densities similar to Dynamic Random-Access Memory (DRAM), power consumption similar to flash memory, and speed similar to Static Random-Access Memory (SRAM). Although MRAM devices exhibit favorable performance characteristics as compared to other memory technologies, there is a continuing need for improved MRAM devices and methods of manufacture thereof.

SUMMARY OF THE INVENTION

The present technology may best be understood by referring to the following description and accompanying drawings that are used to illustrate embodiments of the present technology directed toward Magnetic Tunnel Junction (MTJ) devices.

In one embodiment, device can include a reference magnetic layer having a plurality of trenches disposed therein. One or more sections of a tunnel barrier layer can be disposed on the walls of the plurality of trenches. One or more sections of a free magnetic layer can be disposed on the one or more sections of the tunnel barrier layer in the plurality of trenches. One or more sections of a conductive layer can be disposed on the one or more sections of the free magnetic layer in the plurality of trenches. A plurality of insulator blocks arranged can be disposed between corresponding sections of the tunnel barrier layer, corresponding sections of the free magnetic layer and corresponding sections of the conductive layer in an array of columns and rows in the plurality of trenches. Corresponding sections of the tunnel barrier layer, corresponding section of the free magnetic layer and corresponding sections of the conductive layer disposed between adjacent insulator blocks in one of the plurality of trenches form a Magnetic Tunnel Junction (MTJ) cell.

In another embodiment, a memory device can include an array of Magnetic Tunnel Junction (MTJ) cells. The array of MTJ cells can include a reference magnetic layer including a plurality of trenches. One or more sections of a tunnel barrier layer can be disposed on the walls of the plurality of trenches. One or more sections of a free magnetic layer can be disposed on the one or more sections of the tunnel barrier layer in the plurality of trenches. One or more sections of a conductive layer can be disposed on the one or more sections of the free magnetic layer in the plurality of trenches. A plurality of insulator blocks arranged can be disposed between corresponding sections of the tunnel barrier layer, corresponding sections of the free magnetic layer and corresponding sections of the conductive layer in an array of columns and rows in the plurality of trenches. A bit line can be coupled to the reference magnetic layer. A plurality of select transistors can be coupled to respective sections of the conductive layer in the plurality of trenches.

In yet another embodiment, a device can include a first reference magnetic layer including a first plurality of trenches, and a second reference magnetic layer including a second plurality of trenches. A plurality of sections of a first tunnel barrier layer can be disposed on the walls of the first plurality of trenches. A plurality of sections of a first free magnetic layer can be disposed on the plurality of sections of the first tunnel barrier layer in the first plurality of trenches. A plurality of sections of a first conductive layer can be disposed on the plurality of sections of the first free magnetic layer in the first plurality of trenches. A first plurality of insulator blocks can be disposed between corresponding sections of the first tunnel barrier layer, corresponding sections of the first free magnetic layer and corresponding sections of the first conductive layer in the first plurality of trenches. Similarly, a plurality of sections of a second tunnel barrier layer can be disposed on the walls of the second plurality of trenches. A plurality of sections of a second free magnetic layer can be disposed on the plurality of sections of the second tunnel barrier layer in the second plurality of trenches. A plurality of sections of a second conductive layer can be disposed on the plurality of sections of the second free magnetic layer in the second plurality of trenches. A second plurality of insulator blocks can be disposed between corresponding sections of the second tunnel barrier layer, corresponding sections of the second free magnetic layer and corresponding sections of the second conductive layer in the second plurality of trenches. In addition, an insulator layer can be disposed between a first side of the second reference magnetic layer and a second side of the first reference magnetic layer. A plurality of interconnects can be disposed through the insulator layer and coupled between respective ones of the plurality of sections of the first conductive layer and the second conductive layer.

In yet another embodiment, a memory device can include an array of Magnetic Tunnel Junction (MTJ) cells arranged in cell columns and cell rows in a plurality of cell levels. The MTJ cells in corresponding cell column and cell row positions in the plurality of cell levels can be coupled together in cell strings. The array of MTJ cells can include a first reference magnetic layer including a first plurality of trenches. A plurality of sections of a first tunnel barrier layer can be disposed on the walls of the first plurality of trenches. A plurality of sections of a first free magnetic layer disposed on the plurality of sections of the first tunnel barrier layer in the first plurality of trenches. A plurality of sections of a first conductive layer can be disposed on the plurality of sections of the first free magnetic layer in the first plurality of trenches. A first plurality of insulator blocks can be disposed between corresponding sections of the first tunnel barrier layer, corresponding sections of the first free magnetic layer and corresponding sections of the first conductive layer in the first plurality of trenches. A first insulator layer can be disposed on a first side of the first reference magnetic layer. A first plurality of interconnects can be disposed through the first insulator layer and coupled to respective ones of the plurality of sections of the first conductive layer. The array of MTJ cells can also include a second reference magnetic layer including a second plurality of trenches. A plurality of sections of a second tunnel barrier layer can be disposed on the walls of the second plurality of trenches. A plurality of sections of a second free magnetic layer can be disposed on the plurality of sections of the second tunnel barrier layer in the second plurality of trenches. A plurality of sections of a second conductive layer can be disposed on the plurality of sections of the second free magnetic layer in the second plurality of trenches. A second plurality of insulator blocks can be disposed between corresponding sections of the second tunnel barrier layer, corresponding sections of the second free magnetic layer and corresponding sections of the second conductive layer in the second plurality of trenches. A second insulator layer can be disposed between a first side of the second reference magnetic layer and a second side of the first reference magnetic layer. A second plurality of interconnects disposed through the second insulator layer and coupled between respective ones of the plurality of sections of the first conductive layer and the second conductive layer.

In yet another embodiment, method of manufacturing a MTJ can include forming a planar reference magnetic layer on a planar non-magnetic insulator layer. One or more trenches can be formed through the planar reference magnetic layer. One or more portions of a tunnel insulator layer can be formed on the walls of the one or more trenches. One or more portions of a free magnetic layer can be formed on the one or more portions of the tunnel insulator layer inside the one or more trenches. One or more insulator blocks can be formed adjacent one or more portions of the free magnetic layer in the one or more trenches. One or more conductive cores can be formed between the one or more insulator blocks and between the one or more portions of the free magnetic layer in the one or more trenches.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1:
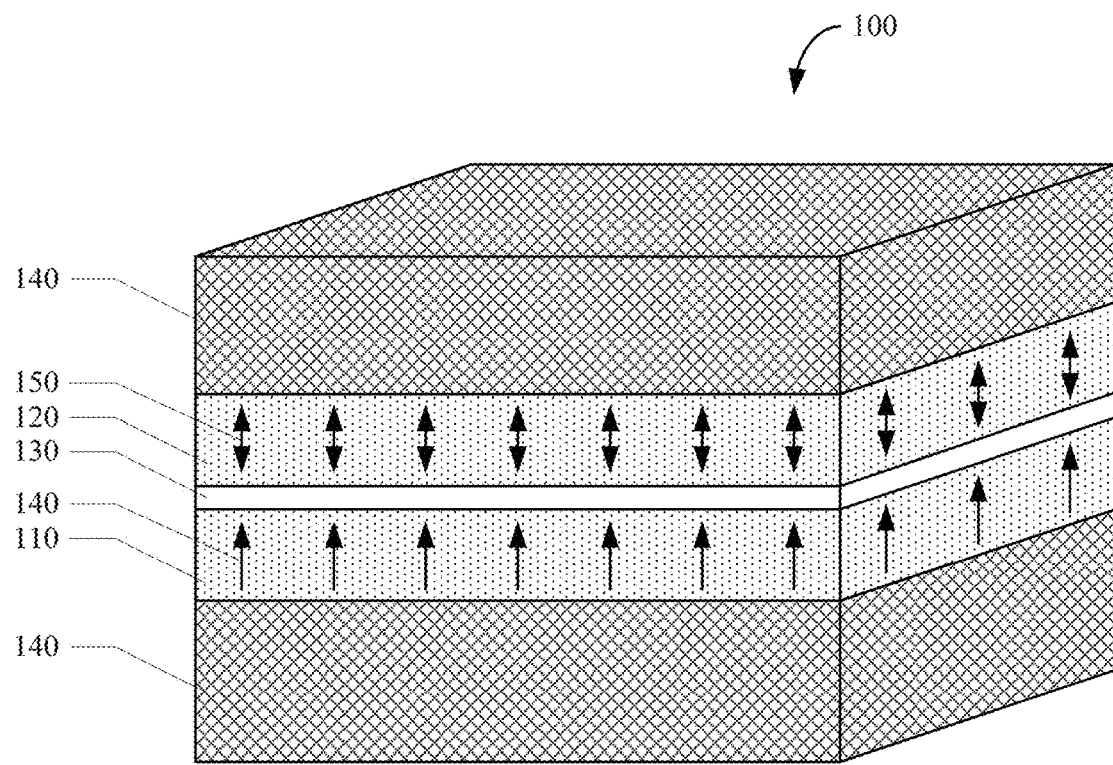
FIG. 1 shows a Magnetic Tunnel Junction (MTJ), in accordance with the conventional art.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 2:
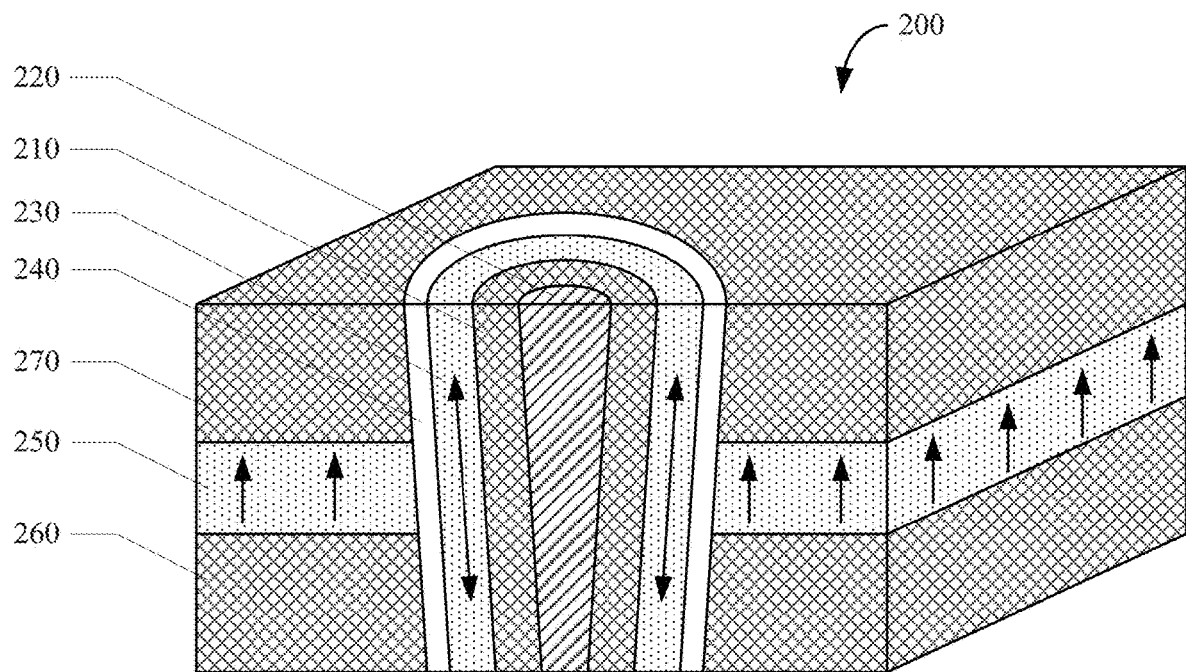
FIG. 2 shows a MTJ, in accordance with aspects of the present technology.

Referring to FIG. 2, a Magnetic Tunnel Junction (MTJ), in accordance with aspects of the technology in the applications identified in the above Cross-Reference to Relate Applications, is shown. The MTJ 200 can include an annular structure 210-240 including an annular non-magnetic layer 210 disposed about an annular conductive layer 220, an annular free magnetic layer 230 disposed about the annular non-magnetic layer 220, and an annular tunnel barrier layer 240 disposed about the annular free magnetic layer 230. The MTJ 200 can also include a planar reference magnetic layer 250 disposed about the annular structure 210-240 and separated from the free magnetic layer 230 by the annular tunnel barrier layer 240.

The MTJ 200 can further include a first planar non-magnetic insulator layer 260 disposed about the annular structure 210-240 and on a first side of the planar reference magnetic layer 250. The MTJ can further include a second planar non-magnetic insulator layer 270 disposed about the annular structure 210-240 and on a second side of the planar reference magnetic layer 250.

In one implementation, the annular structure can be a substantially cylindrical structure with tapered sidewalls. In one implementation, the conical structure can have a taper of approximately 10-45 degrees from a first side of the planar reference magnetic layer 250 to a second side of the planar reference magnetic layer 250. In another expression, the wall angle measured from the normal axis to the horizontal direction of the planar reference magnetic layer 250 can be approximately 10-45 degrees. In one implementation, the annular tunnel insulator 240, the annular free magnetic layer 230, and the annular non-magnetic layer 210 can be concentric regions each bounded by inner and outer respective tapered cylinders having substantially the same axis, disposed about a solid tapered cylindrical region of the annular conductive layer 220.

In aspects, the magnetic field of the planar reference magnetic layer 250 can have a fixed polarization substantially perpendicular to a major planar orientation of the planar reference magnetic layer 250. The magnetic field of the annular free magnetic layer 230 can have a polarization substantially perpendicular to the major planar orientation of the planar reference magnetic layer 250 and selectively switchable between being substantially parallel and substantially antiparallel to the magnetic field of the planar reference layer 250. In one implementation, the magnetic field of the annular free magnetic layer 230 can be configured to switch to being substantially parallel to the magnetic field of the planar reference layer 250 in response to a current flow in a first direction through the conductive annular layer 220 and to switch to being substantially anti-parallel to the magnetic field of the planar reference layer 250 in response to a current flow in a second direction through the conductive annular layer 220. More generally, the polarization direction, either parallel or anti-parallel, can be changed by a corresponding change in the current direction. Therefore, regardless of the definition of the current flowing direction, the polarization of the annular free magnetic layer 230 can switch to the other polarization orientation by switching the current direction.

Figure 3:
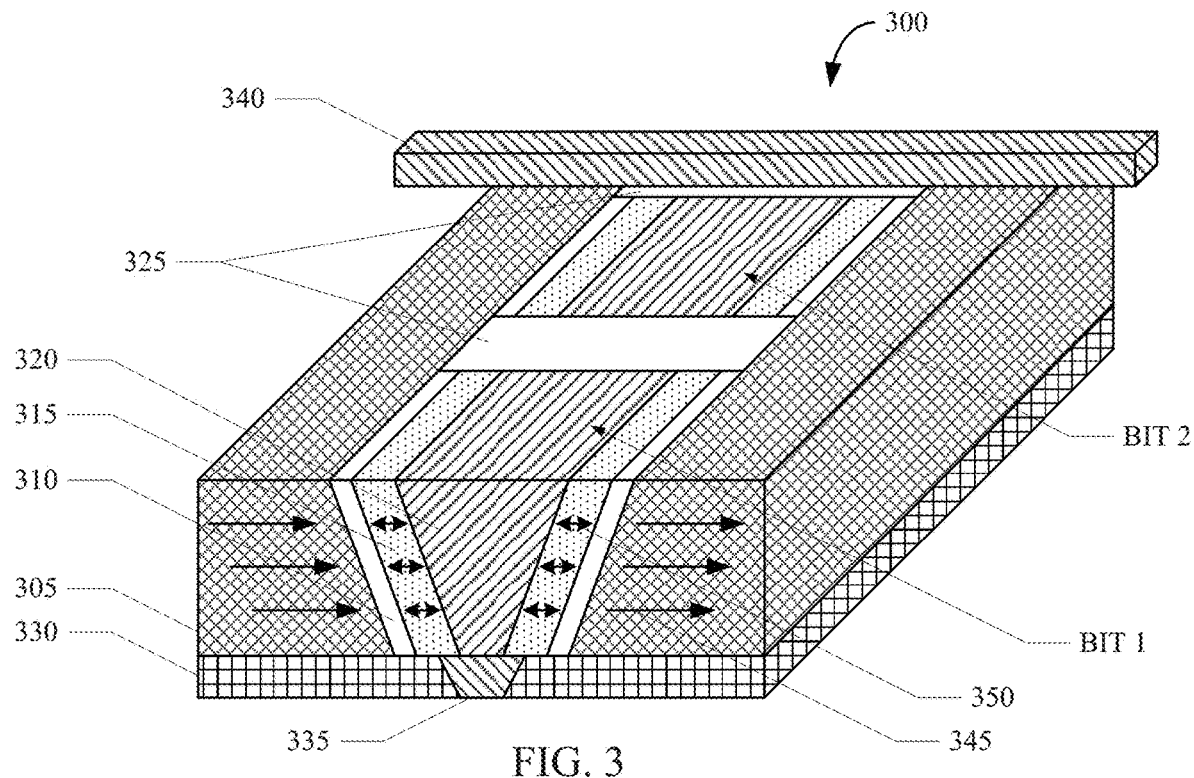
FIG. 3 shows one or more MTJs, in accordance with aspects of the present technology.

Referring to FIG. 3, one or more Magnetic Tunnel Junctions (MTJs), in accordance with aspects of the present technology, is shown. The one or more MTJs 300 can include a reference magnetic layer 305 including one or more trenches. The one or more MTJs 300 can further include one or more sections of a tunnel barrier layer 310 disposed on the walls of the one or more trenches, one or more sections of a free magnetic layer 315 disposed on the one or more sections of the tunnel barrier layer 310 in the one or more trenches, and one or more sections of a conductive layer 320 disposed on the one or more sections of the free magnetic layer 315 in the one or more trenches. The one or more MTJs 300 can also optionally include one or more sections of a non-magnetic capping layer (not shown) disposed between the one or more sections of the free magnetic layer 315 and the one or more sections of the conductive layer 320 in the one or more trenches. The one or more MTJs 300 can further include one or more insulator blocks 325 disposed between corresponding sections of the tunnel barrier layer 310, free magnetic layer 315 and conductive layer 320. For example, an insulator block 325 can be disposed between a first and second set of corresponding sections of the tunnel barrier layer 310, free magnetic layer 315, the optional non-magnetic capping layer and the conductive layer 320 to form a first MTJ (e.g., Bit 1) and a second MTJ (e.g., Bit 2).

The one or more MTJs 300 can further include a first set of one or more additional layers disposed on a first side of the reference magnetic layer 305. In one instance, the first set of one or more additional layers can include a conductive buffer layer (e.g., Perpendicular Magnetic Anisotropy (PMA) enhancer) (not shown), an insulator layer 330 and one or more interconnects 335. For example, the insulator layer 330 can be disposed on the first side of the reference magnetic layer 305, the tunnel barrier layer 310 and free magnetic layer 315. The interconnect 335 can be coupled to the conductive layer 320.

The one or more MTJs 300 can further include one or more bit lines 340 disposed on a second side of the reference magnetic layer 305, and across one or more insulator blocks 325. For example, one or more bit lines 340 can be coupled to one or more portions of reference magnetic layer 305, and isolated from the tunnel barrier layer 310, free magnetic layer 315 and conductive layer 320 by the one or more insulator blocks 325. The one or more MTJs 300 can also include a second set of one or more additional layers (not shown) disposed on the second side of the reference magnetic layer 305. In one instance, the second set of one or more additional layers can include a capping layer (e.g., PMA enhancer) and an insulator layer.

In one implementation, the reference magnetic layer 305 can include one or more layers of a Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi), or compounds thereof, with a thickness of approximately 1-20 nm, preferably 1 to 10 nm, and more preferably 1 to 5 nm. The tunnel insulator layer 310 can include one or more layers of a Magnesium Oxide (MgO), Silicon Oxide (SiOx), Aluminum Oxide (AlOx), Titanium Oxide (TiOx) or combination of these oxide materials with a thickness of approximately 0.2 to 2.0 nm. The free magnetic layer 315 can include one or more layers of a Cobalt-Iron-Boron (Co—Fe—B), Cobalt-Nickle-Iron (CoNiFe), Nickle-Iron (NiFe) alloy or their multilayer combinations with a thickness of approximately 1-10 nm, and preferably 1 to 5 nm. The non-magnetic capping layer (not shown) can include one or more layers of metal protecting layers that can include one or more elements of a Tantalum (Ta), Chromium (Cr), Tungsten (W), Vanadium (V), Platinum (Pt), Ruthenium (Ru), Palladium (Pd), Copper (Cu), Silver (Ag), Rhodium (Rh), or their alloy, with a thickness of approximately 1 to 5 nm. The conductive layer 320 can include one or more layers of Copper (Cu), Aluminum (Al), Ruthenium (Ru), and/or one or more alloys thereof with a thickness of approximately 5-20 nm. The first and second sets of additional layers can include one or more insulator layers of MgO, SiOx, AlOx. are alloys thereof with a thickness of the first and second additional layers in the range of 5 to 20 nm, preferably 5 to 10 nm. The first and second sets of additional layers can also include one or more buffer and/or capping layers of Ta, Cr, W, V, Mo, Pt, Ru, Pd, Cu, Ag, Rh, or their alloy, with a thickness of approximately 1 to 10 nm.

In one implementation, the walls of the one or more trenches can have a taper of approximately 10-45 degrees from the second side of the reference magnetic layer 305 to the first side of the planar reference magnetic layer 305. In another expression, the wall angle measured from the normal axis to the horizontal direction of the reference magnetic layer 305 can be approximately 10-45 degrees.

In aspects, the magnetic field 345 of the reference magnetic layer 305 can have a fixed polarization substantially parallel to a major planar orientation of the planar reference magnetic layer 305, and the magnetic field 350 of the free magnetic layer 315 can have a polarization substantially parallel to the major planar orientation of the reference magnetic layer 305, as illustrated in FIG. 3. The magnetic field 350 of the free magnetic layer 315 can be selectively switchable between being substantially parallel and substantially antiparallel to the magnetic field 345 of the planar reference layer 305. In one implementation, the magnetic field 350 of the free magnetic layer 315 can be configured to switch to being substantially parallel to the magnetic field 345 of the reference layer 305 in response to a current flow in a first direction through the conductive layer 320 and to switch to being substantially anti-parallel to the magnetic field 345 of the reference layer 305 in response to a current flow in a second direction through the conductive layer 320. More generally, the polarization direction, either parallel or anti-parallel, can be changed by a corresponding change in the current direction. Therefore, regardless of the definition of the current flowing direction, the polarization of the free magnetic layer 315 can switch to the other polarization orientation by switching the current direction.

Figure 4:
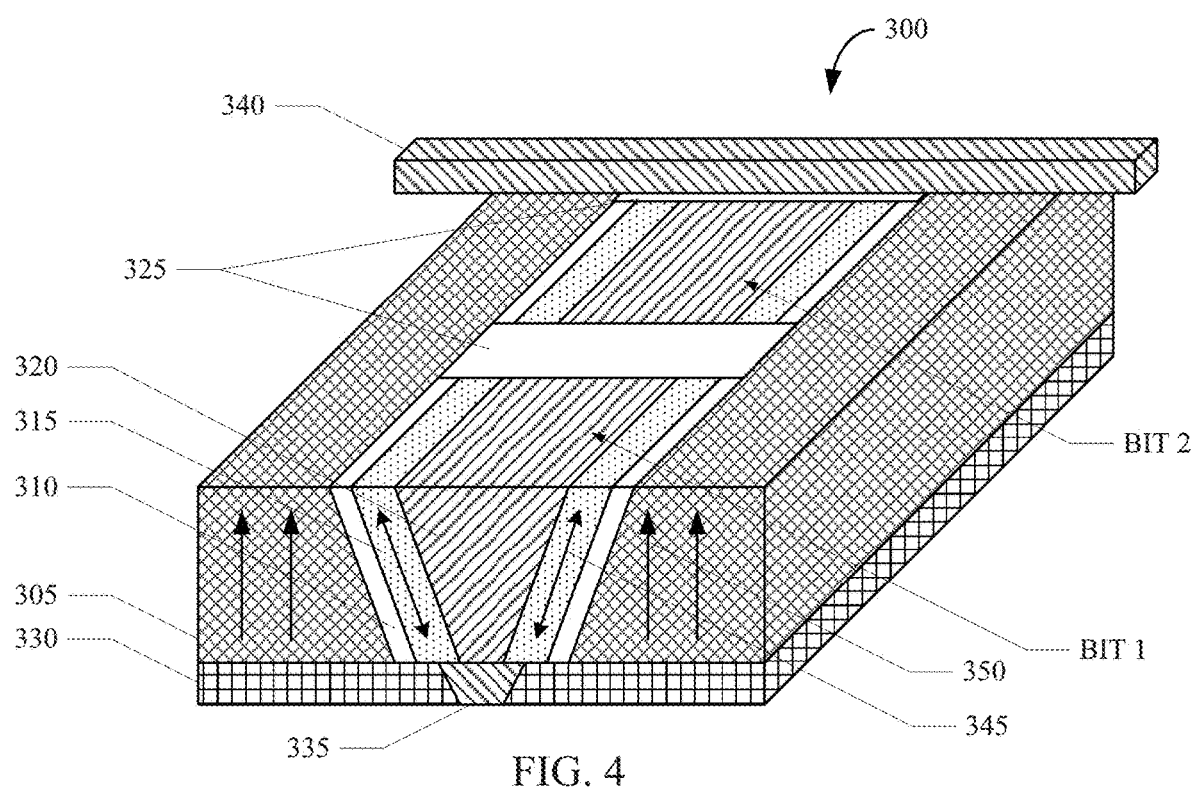
FIG. 4 shows one or more MTJs, in accordance with aspects of the present technology.

In another implementation, the magnetic field 345 of the reference magnetic layer 305 can have a fixed polarization substantially perpendicular to a major planar orientation of the planar reference magnetic layer 305, and the magnetic field 350 of the free magnetic layer 315 can have a polarization substantially perpendicular to the major planar orientation of the reference magnetic layer 305, as illustrated in FIG. 4.

Figure 5:
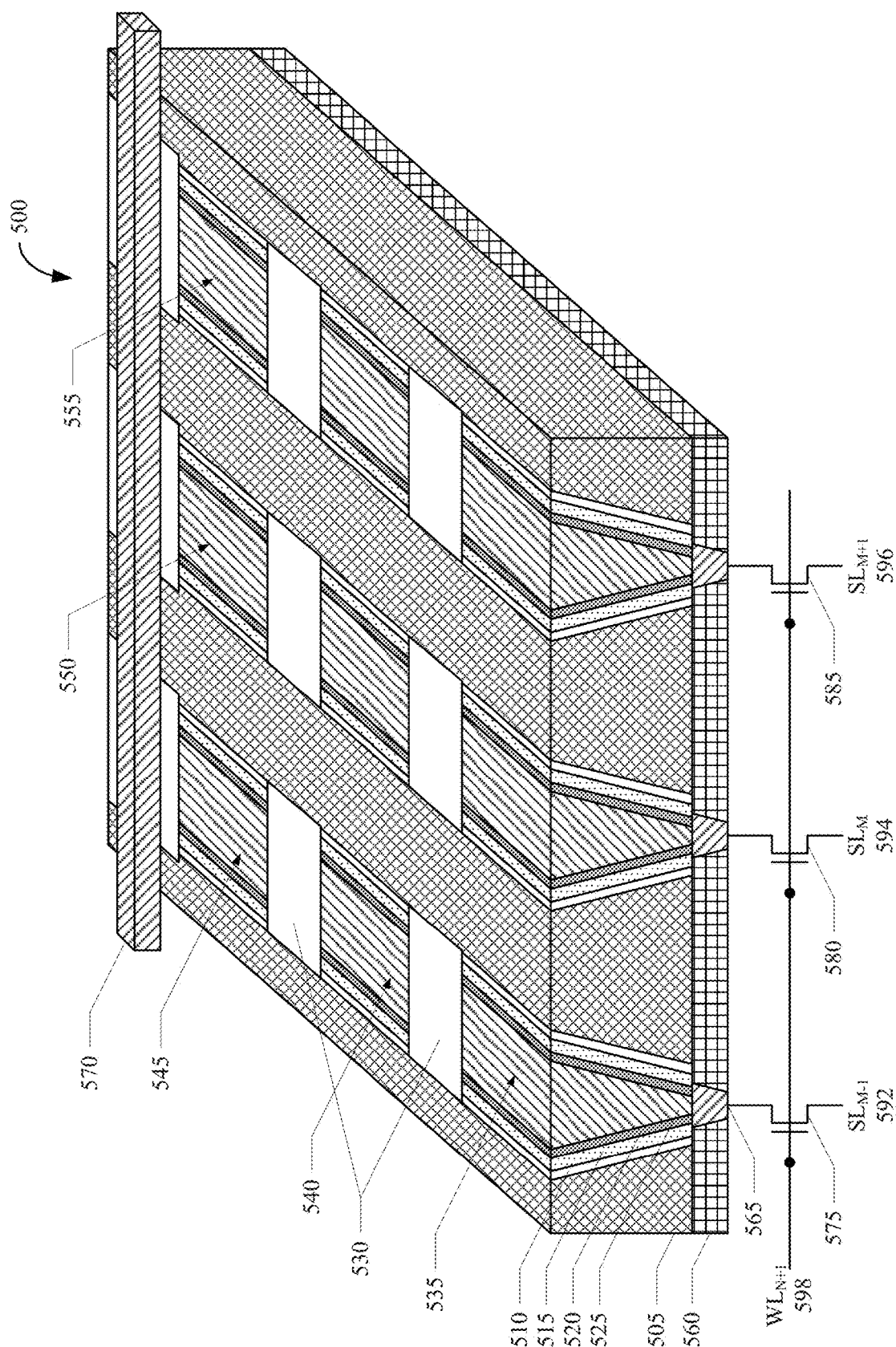
FIG. 5 shows a device including an array of MTJs, in accordance with aspects of the present technology.

Referring now to FIG. 5, a device including an array of Magnetic Tunnel Junctions (MTJs), in accordance with aspects of the present technology, is shown. In one implementation, the device 500 can be a memory cell array. The device 500 can include a reference magnetic layer 505 including a plurality of trenches. The trenches can be substantially parallel to each other. The device 500 can further include a plurality of sections of a tunnel barrier layer 510 disposed on the walls of the trenches, a plurality of sections of a free magnetic layer 515 disposed on the sections of the tunnel barrier layer 510 in the trenches, a plurality of sections of an optional non-magnetic capping layer 520 disposed on the sections of the free magnetic layer 515 and one or more sections of a conductive layer 525 disposed on the one or more sections of the non-magnetic capping layer 520 in the one or more trenches. The device 500 can further include a plurality of insulator blocks 530 disposed between corresponding sections of the tunnel barrier layer 510, free magnetic layer 515, optional non-magnetic capping layer 520 and conductive layer 525. For example, insulator blocks 530 can be disposed between a first, second and third set of corresponding sections of the tunnel barrier layer 510, free magnetic layer 515, the optional non-magnetic capping layer 520 and the conductive layer 525 to form a first MTJ 535, a second MTJ 540 and third MTJ 545. The insulator blocks 530 can be arranged in an array in the plurality of trenches to form rows of MTJs 535, 540, 545 along trenches, and columns of MTJs 545, 550, 555 across the trenches.

The one or more MTJs 500 can further include a first set of one or more additional layers disposed on a first side of the reference magnetic layer 505. In one instance, the first set of one or more additional layers can include a conductive buffer layer (e.g., Perpendicular Magnetic Anisotropy (PMA) enhancer for one of the implementations) (not shown), an insulator layer 560 and an interconnect 565. For example, the insulator layer 560 can be disposed on the first side of the reference magnetic layer 505, the tunnel barrier layer 510 and free magnetic layer 415. The interconnect 565 can be coupled to the conductive layer 545 and the optional non-magnetic capping layer 520.

The device 500 can further include one or more bit lines 570 disposed on a second side of the reference magnetic layer 505, and across one or more insulator blocks 530. For example, one or more bit lines 570 can be coupled to one or more portions of reference magnetic layer 505, and isolated from the free magnetic layer 515, optional non-magnetic capping layer 520 and conductive layer 525 by the one or more insulator blocks 530. The device 500 can also include a second set of one or more additional layers (not shown) disposed on the second side of the reference magnetic layer 505. In one instance, the second set of one or more additional layers can include a capping layer (e.g., PMA enhancer for one of the implementations) and an insulator layer. The device can further include a plurality of select elements 575, 580, 585, a plurality of source lines 592, 594, 596, and a plurality of word lines 598. The MTJ cells 535-555 arranged along columns and rows can be coupled by a corresponding select transistor 575, 580, 585 to a respective source line 592, 594, 596. The gate of the select transistors 575, 580, 585 can be coupled to a respective word line 598.

In one implementation, the reference magnetic layer 505 can include one or more layers of a Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi), or compounds thereof, with a thickness of approximately 1-20 nm, preferably 1 to 10 nm, and more preferably 1 to 5 nm. The tunnel insulator layer 510 can include one or more layers of a Magnesium Oxide (MgO), Silicon Oxide (SiOx), Aluminum Oxide (AlOx), Titanium Oxide (TiOx) or combination of these oxide materials with a thickness of approximately 0.2 to 2.0 nm. The free magnetic layer 515 can include one or more layers of a Cobalt-Iron-Boron (Co—Fe—B), Cobalt-Nickle-Iron (CoNiFe), Nickle-Iron (NiFe) alloy or their multilayer combinations with a thickness of approximately 1-10 nm, and preferably 1 to 5 nm. The non-magnetic capping layer 520 can include one or more layers of metal protecting layers that can include one or more elements of a Tantalum (Ta), Chromium (Cr), Tungsten (W), Vanadium (V), Platinum (Pt), Ruthenium (Ru), Palladium (Pd), Copper (Cu), Silver (Ag), Rhodium (Rh), or their alloy, with a thickness of approximately 1 to 5 nm. The conductive layer 525 can include one or more layers of Copper (Cu), Aluminum (Al), Ruthenium (Ru), and/or one or more alloys thereof with a thickness of approximately 5-20 nm. The first and second sets of additional layers can include one or more insulator layers of MgO, SiOx, AlOx. and alloys thereof with a thickness of the first and second additional layers in the range of 5 to 20 nm, preferably 5 to 10 nm. The first and second sets of additional layers can also include one or more buffer and/or capping layers of Ta, Cr, W, V, Mo, Pt, Ru, Pd, Cu, Ag, Rh, or their alloy, with a thickness of approximately 1 to 10 nm.

In one implementation, the walls of the one or more trenches can have a taper of approximately 10-45 degrees from the second side of the reference magnetic layer 505 to the first side of the reference magnetic layer 505. In another expression, the wall angle measured from the normal axis to the horizontal direction of the reference magnetic layer 505 can be approximately 10-45 degrees.

In aspects, the magnetic field of the reference magnetic layer 505 can have a fixed polarization substantially parallel to a major planar orientation of the planar reference magnetic layer 505, and the magnetic field of the free magnetic layer 515 can have a polarization substantially parallel to the major planar orientation of the reference magnetic layer 505, as illustrated in FIG. 3. The magnetic field of a given portion of the free magnetic layer 515 can be selectively switchable between being substantially parallel and substantially anti-parallel to the magnetic field of the planar reference layer 505. In one implementation, the magnetic field of a given portion of the free magnetic layer 515 can be configured to switch to being substantially parallel to the magnetic field of the reference layer 505 in response to a current flow in a first direction through a corresponding portion of the conductive layer 525 and to switch to being substantially anti-parallel to the magnetic field of the reference layer 505 in response to a current flow in a second direction through the corresponding portion of the conductive layer 525. In another implementation, the magnetic field of the reference magnetic layer 505 can have a fixed polarization substantially perpendicular to a major planar orientation of the planar reference magnetic layer 505, and the magnetic field of the free magnetic layer 515 can have a polarization substantially perpendicular to the major planar orientation of the reference magnetic layer 505, as illustrated in FIG. 4.

Figure 6:
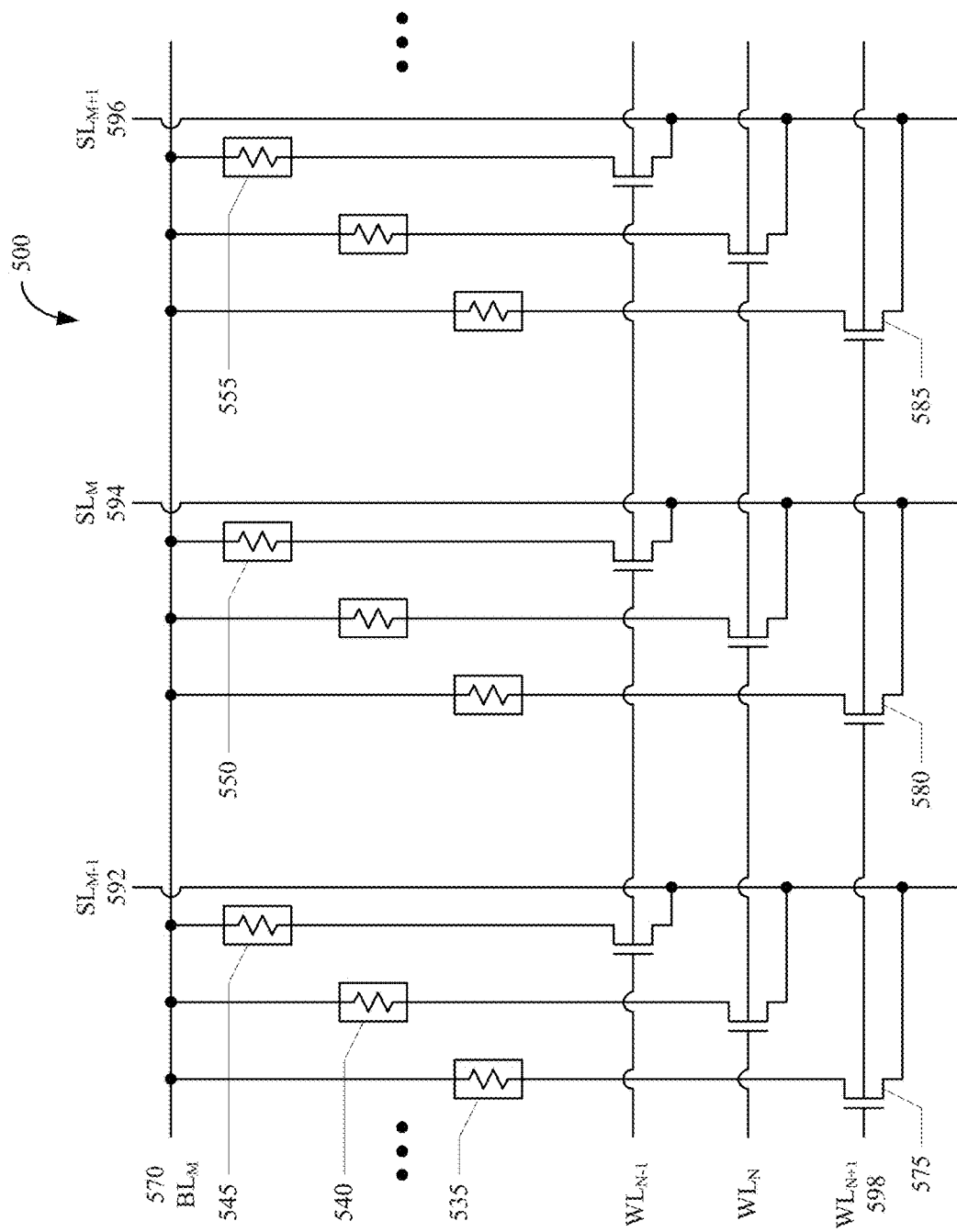
FIG. 6 shows a device including an array of MTJs, in accordance with aspects of the present technology.

Referring now to FIG. 6, a schematic representation of a memory cell array as described above with respect to FIG. 5 is shown. The memory cell array 500 can include a plurality of MTJ cells 535-555, a plurality of bit lines 570, a plurality of source lines 592, 594, 596, a plurality of word lines 598, and a plurality of select transistor 575, 580, 585. The plurality of MTJ cells 535-555 can be coupled to one or more bit lines 570. The MTJ cells arranged along columns 535, 540, 545 can be coupled by a corresponding select transistor 598 to a respective source line 592, 594, 596. The gate of the select transistors 592, 594, 596 can be coupled to a respective word line 598. In one implementation, a logic '0' state can be written to a given memory cell 53510 by biasing the respective bit line 570 at a bit line write potential (e.g., $V_{BLW}$), biasing the respective source line 575 at a ground potential, and driving the respective word line 598 at a word line write potential (e.g., $V_{WLW}=V_{Hi}$). The word lines 598 for the cells that are not being written to can be biased at a ground potential. In addition, the other source lines 594, 596 can be biased at a high potential or held in a high impedance state. The high potential can be equal to the bit line write potential or some portion thereof. A logic '1' state can be written to the given memory cell 535 by biasing the respective bit line 570 at a ground potential, biasing the respective source line 592 at a source line write potential (e.g., $V_{SLW}$), and driving the respective word line 598 at the word line write potential (e.g., $V_{WLW}=V_{Hi}$). The word lines for the cells that are not being written to can be biased at ground potential. In addition, the other source lines 594, 596 can be biased at a low potential or held in a high impedance state. The state of the given memory cell 535 can be read by biasing the respective bit line 570 at a bit line read potential (e.g., $V_{BLR}$), biasing the respective source line 592 at a ground potential, driving the respective word line 598 at a word line read potential ($V_{WLR}=V_{Hi}$), and sensing the resulting current on the respective source line 592. The word lines for the cells that are not being read can be biased at a ground potential. In addition, the other source lines 594, 596 can be biased at a high potential or held in a high impedance state. The high potential can be equal to the bit line read potential or some portion thereof.

Figure 7:
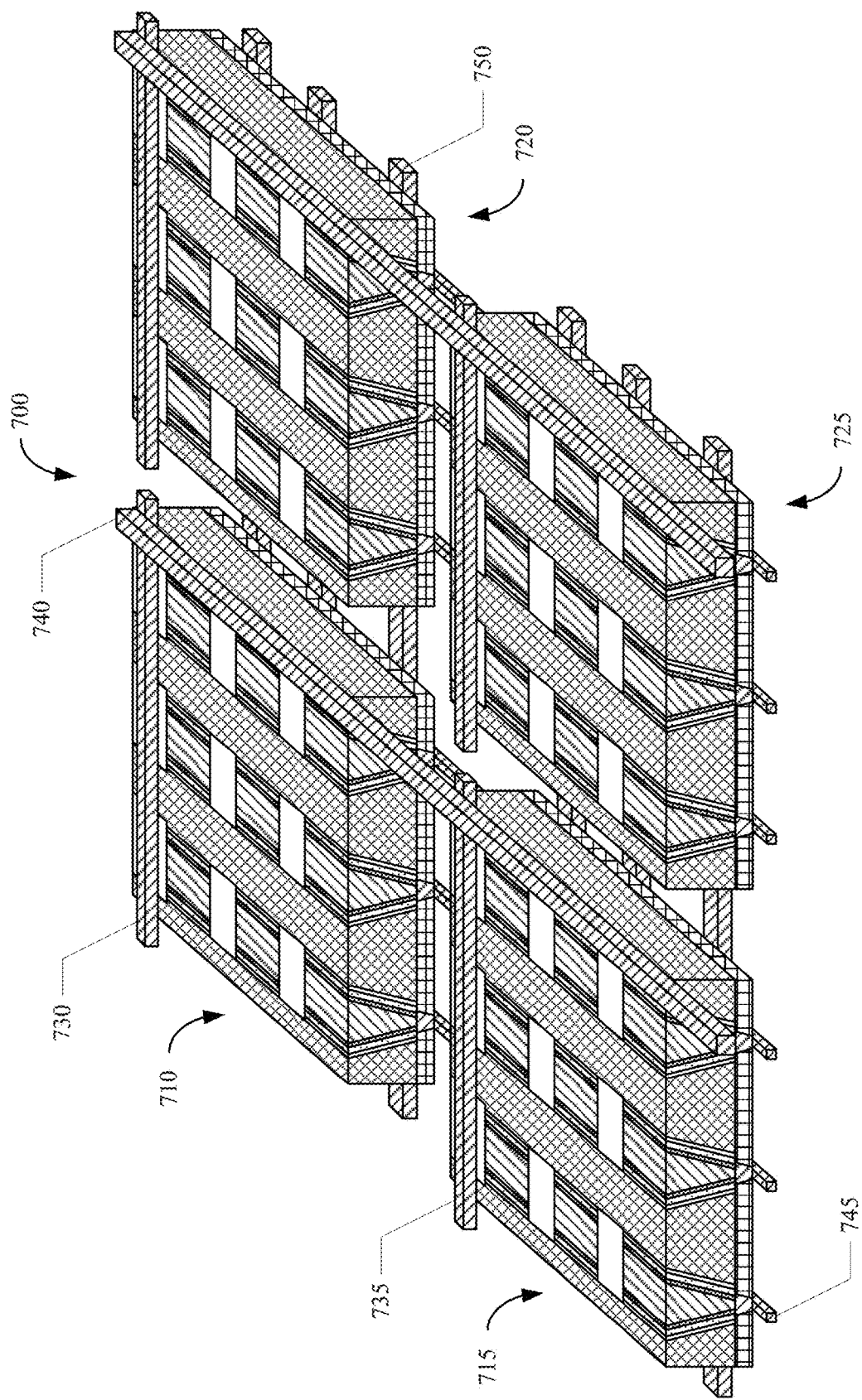
FIG. 7 shows a memory device, in accordance with aspects of the present technology.

Referring now to FIG. 7, a memory device, in accordance with aspects of the present technology, is shown. The memory device 700 can include a plurality of memory cell array blocks 705-720. Each memory cell array block 705-720 can include a plurality of MTJ cells as described above in more detail with respect to FIGS. 5 and 6. Two or more bit lines 730, 735 of the memory cell array blocks 710, 715 arranged in respective columns can be coupled together by a corresponding global bit line 740. In addition, the source lines 745 of the memory cell array blocks 710, 715 arranged in respective columns can be coupled together. Likewise, the word lines 750 of the memory cell array blocks 715, 725 arranged in respective rows can be coupled together. The memory device 700 will be further explained with reference to FIG. 8, which illustrates a schematic representation of the memory device.

Figure 8:
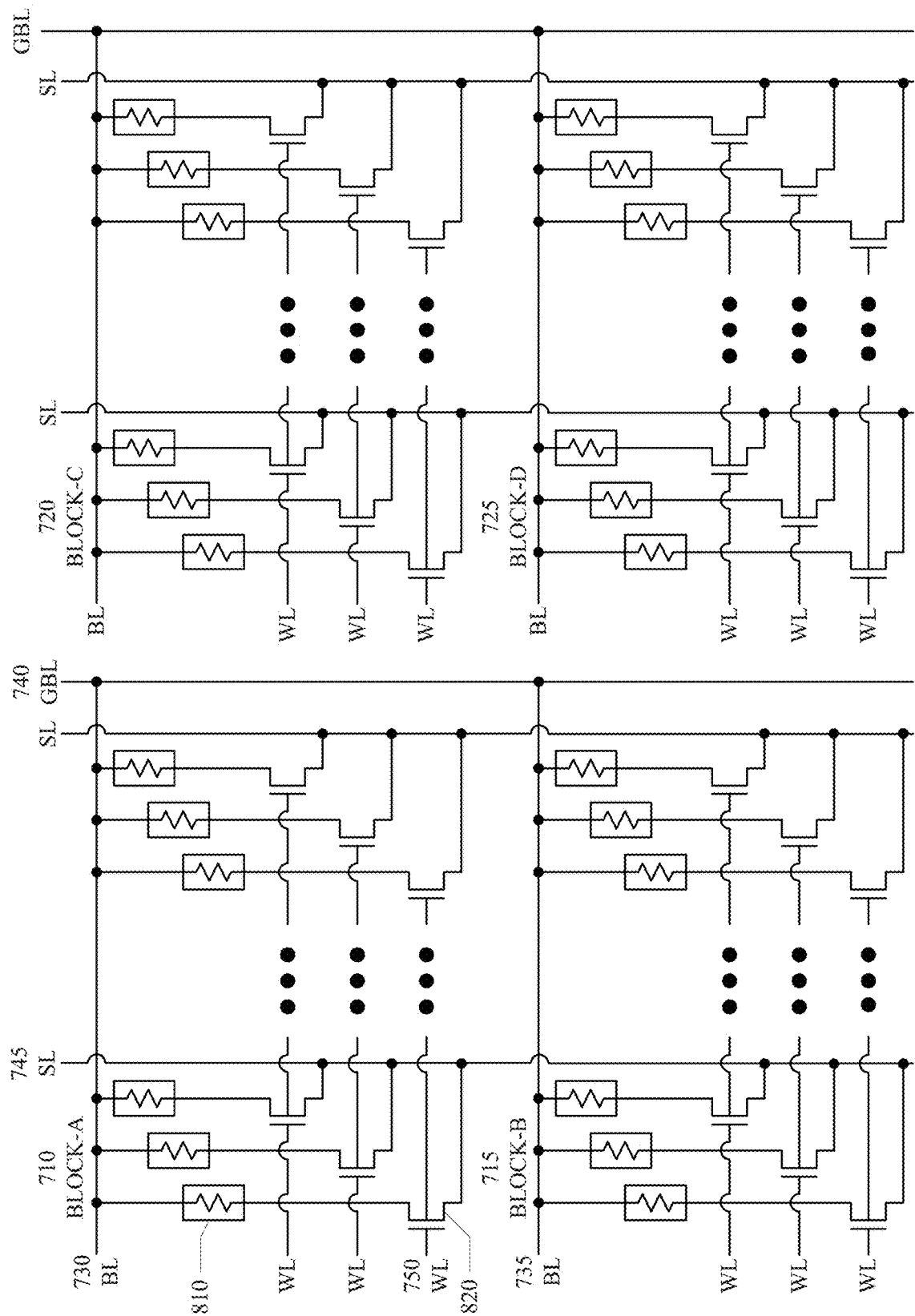
FIG. 8 shows a memory device, in accordance with aspects of the present technology.

Referring now to FIG. 8, the memory device 700 can include a plurality of memory cell array blocks 705-720. Each memory cell array block can include a plurality of MTJ cells 810, a plurality of bit lines 730, a plurality of source lines 745, a plurality of word lines 750, and a plurality of select transistor 820. The MTJ cells arranged along columns 810 can be coupled by a corresponding select transistor 820 to a respective source line 745. The gate of the select transistors can be coupled to a respective word line 750. Two or more bit lines 730, 735 of the memory cell array blocks 710, 715 arranged in respective columns can be coupled together by a corresponding global bit line 740. In addition, the source lines 745 of the memory cell array blocks 710, 715 arranged in respective columns can be coupled together. Likewise, the word lines 750 of the memory cell array blocks 715, 725 arranged in respective rows can be coupled together.

In one implementation, logic '0' and '1' states can be written to a given memory cell 810 by biasing the global bit line 740 which also biases the respective bit line 730 at a bit line write potential (e.g., $V_{BLW}$), biasing the respective source line 745 at a ground potential, and driving the respective word line 750 at a word line write potential (e.g., $V_{WLW}=V_{Hi}$). The word lines for the cells that are not being written to can be biased at a ground potential. In addition, the other source lines can be biased at a high potential or held in a high impedance state. The high potential can be equal to the bit line write potential or some portion thereof. A logic '1' state can be written to the given memory cell 810 by biasing the global bit line 740 which also biases the respective bit line 730 at a ground potential, biasing the respective source line 745 at a source line write potential (e.g., $V_{SLW}$), and driving the respective word line 750 at the word line write potential (e.g., $V_{WLW}=V_{Hi}$). The word lines for the cells that are not being written to can be biased at ground potential. In addition, the other source lines can be biased at a low potential or held in a high impedance state. The state of the given memory cell 810 can be read by biasing the global bit line 740 which also biases the respective bit line 730 at a bit line read potential (e.g., $V_{BLR}$), biasing the respective source line 745 at a ground potential, driving the respective word line 750 at a word line read potential ($V_{WLR}=V_{Hi}$), and sensing the resulting current on the respective source line 745. The word lines for the cells that are not being read can be biased at a ground potential. In addition, the other source lines can be biased at a high potential or held in a high impedance state. The high potential can be equal to the bit line read potential or some portion thereof.

Figure 9:
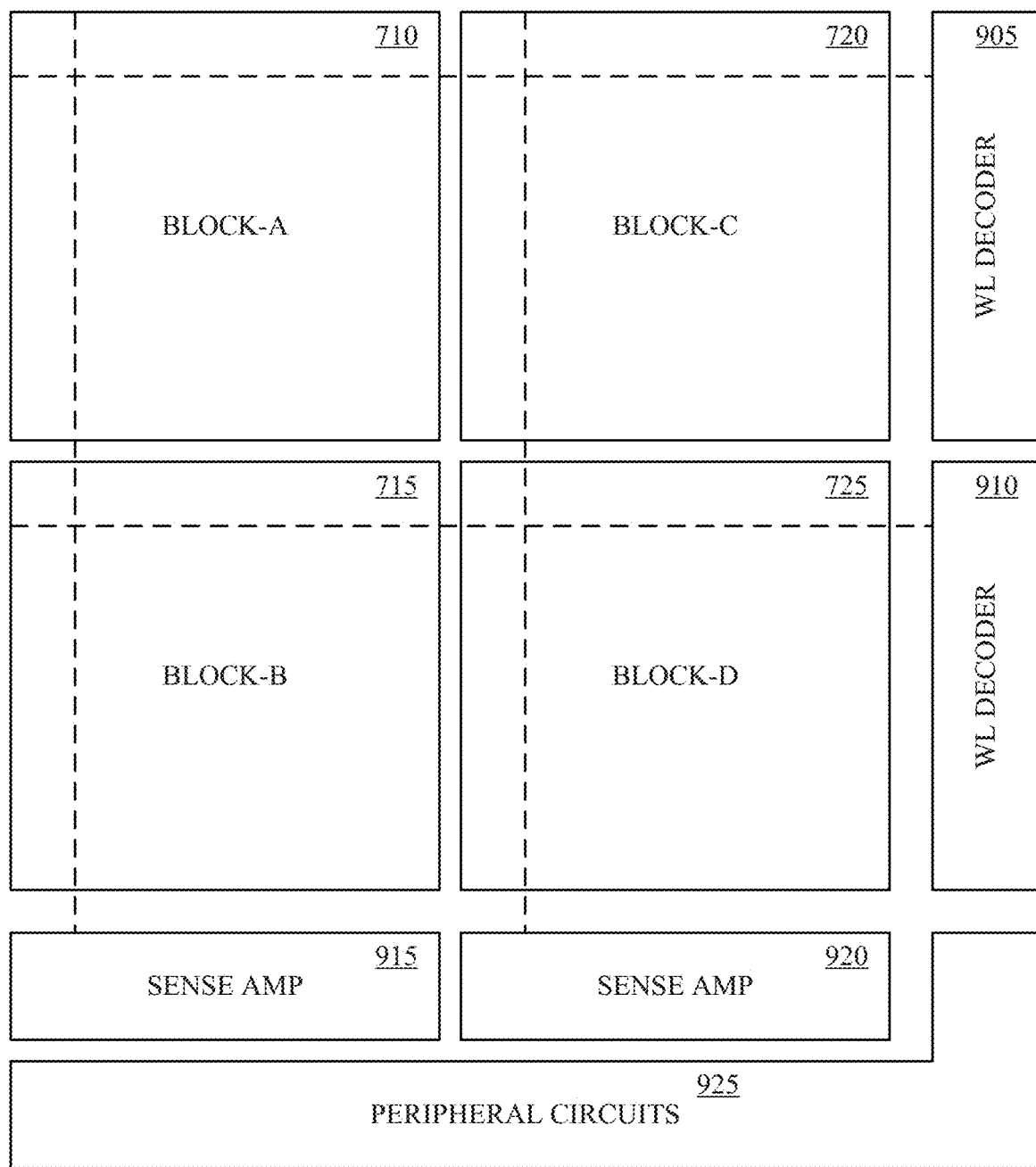
FIG. 9 shows a memory device, in accordance with aspects of the present technology.

Referring now to FIG. 9, a memory device, in accordance with aspects of the present technology, is shown. In one implementation, the memory device can be a Magnetoresistive Random Access Memory (MRAM). The memory device 900 can include a plurality of memory cell array blocks 710-725, one or more word line decoders 905, 910, one or more sense amplifier circuits 915, 920, and peripheral circuits 925. The memory device 900 can include other well-known circuits that are not necessary for an understanding of the present technology and therefore are not discussed herein.

Each memory cell array block 710-725 can include can include a plurality of MTJ cells 810, a plurality of bit lines 730, a plurality of source lines 745, a plurality of word lines 750, and a plurality of select transistor 820 as described in more detail above with reference to FIGS. 7 and 8. The peripheral circuits 925, the word line decoders 905, 910 and sense amplifier circuits 915, 920 can map a given memory address to a particular row of MTJ memory cells in a particular memory cell array block 710-725. The output of the word line drivers 905, 910 can drive the word lines to select a given word line of the array. The sense amplifier circuits 915, 920 utilize the source lines and bit lines of the array to read from and write to memory cells of a selected word line in a selected memory cell array block 710-725.

In one aspect, the peripheral circuits 925 and the word line decoders 905, 910 can be configured to apply appropriate write voltages to bit lines, source lines and word lines to write data to cells in a selected word. The magnetic polarity, and corresponding logic state, of the free layer of the MTJ cell can be changed to one of two states depending upon the direction of current flowing through the MTJ cell. For read operations, the peripheral circuits 925, the word line decoders 905, 910 and sense amplifier circuits 915, 920 can be configured to apply appropriate read voltages to the bit lines, sources lines and word lines to cause a current to flow in the source lines that can be sensed by the sense amplifier circuits 915, 920 to read data from cells in a selected word.

Figure 10:
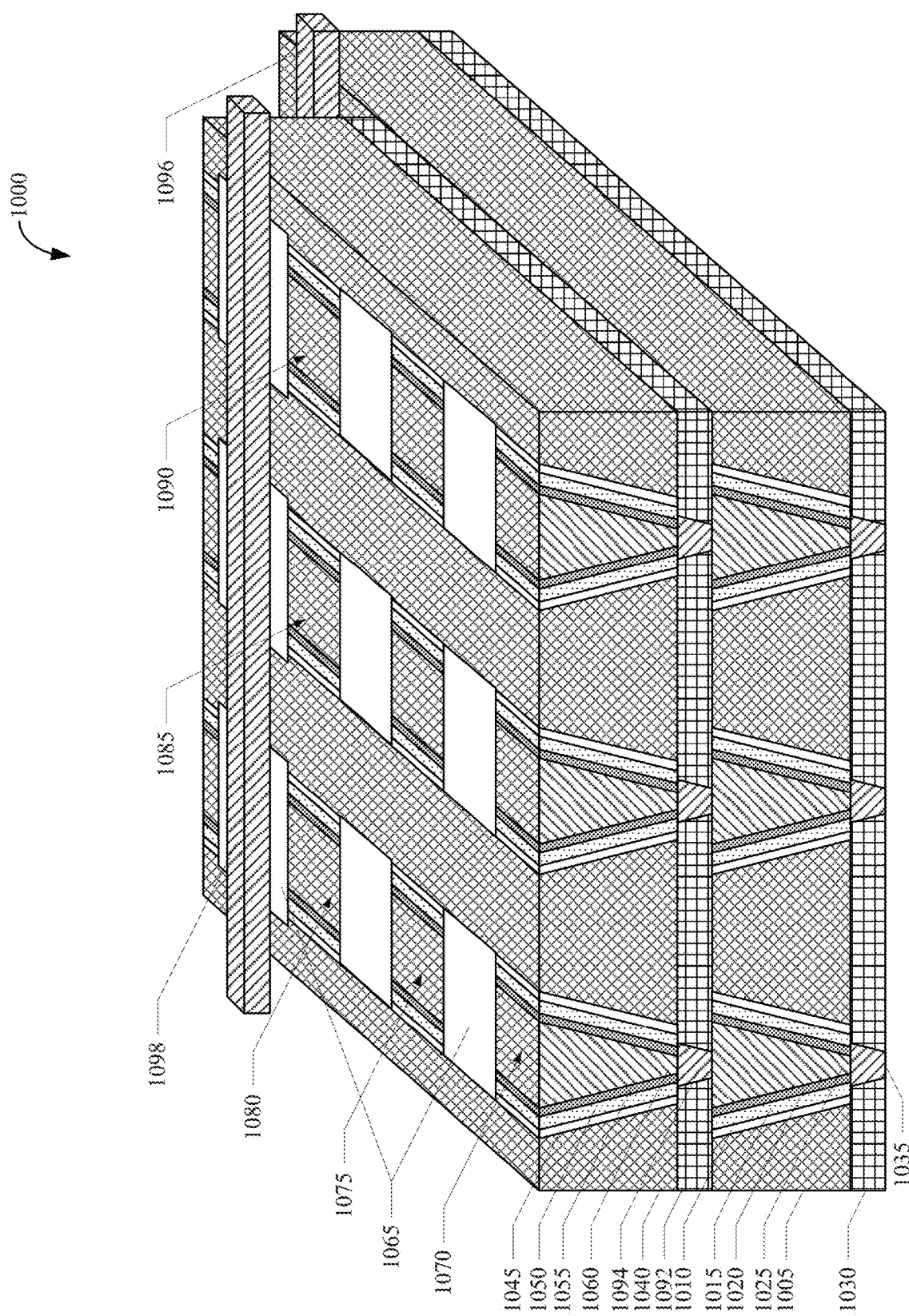
FIG. 10 shows a device including an array of MTJ cells, in accordance with aspects of the present technology.

Referring now to FIG. 10, a device including an array MTJs, in accordance with aspects of the present technology, is shown. In one implementation, the device 1000 can be a memory cell array. The device can include a first magnetic layer 1005 including a first plurality of trenches. The first plurality of trenches can be substantially parallel to each other. The device 1000 can further include a plurality of sections of a first tunnel barrier layer 1010 disposed on the wall of the first plurality of trenches, a plurality of sections of a first free magnetic layer 1015 disposed on the sections of the first tunnel barrier layer 1010, a plurality of sections of an optional first non-magnetic capping layer 1020 disposed on the sections of the first free magnetic layer 1015, and a plurality of sections of a first conductive layer 1025 disposed on the sections of the optional first non-magnetic capping layer 1020 in the first plurality of trenches. The device 1000 can further include a first plurality of insulator blocks disposed between corresponding sections of the first tunnel barrier layer 1010, the first free magnetic layer 1015, the optional first non-magnetic capping layer 1020, and the first conductive layer 1025. The first plurality of insulator blocks can be arranged in an array in the plurality of trenches to form rows of MTJs along the first plurality of trenches, and columns of MTJs across the first plurality of trenches. The device 1000 can further include a first insulator layer 1030 and a first plurality of interconnects 1035. The first insulator layer 1030 can be disposed on the first side of the reference magnetic layer 1005, the first tunnel barrier layer 1010, and the first free magnetic layer 1015. The first plurality of interconnects 1035 can be coupled to the first conductive layer 1025 and the optional first magnetic capping layer 1020.

The device 1000 can further include a second magnetic layer 1040 including a second plurality of trenches. The second plurality of trenches can be substantially parallel to each other and to the first plurality of trenches in the first magnetic layer 1005. The device 1000 can further include a plurality of sections of a second tunnel barrier layer 1045 disposed on the wall of the second plurality of trenches, a plurality of sections of a second free magnetic layer 1050 disposed on the sections of the second tunnel barrier layer 1045, a plurality of sections of an optional second non-magnetic capping layer 1055 disposed on the sections of the second free magnetic layer 1050, and a plurality of sections of a second conductive layer 1060 disposed on the sections of the optional second non-magnetic capping layer 1055 in the second plurality of trenches. The device 1000 can further include a second plurality of insulator blocks 1065 disposed between corresponding sections of the second tunnel barrier layer 1045, the second free magnetic layer 1050, the optional second non-magnetic capping layer 1055, and the second conductive layer 1060. The second plurality of insulator blocks 1065 can be arranged in an array in the second plurality of trenches to form rows of MTJs 1070-1080 along the second plurality of trenches, and columns of MTJs 1080-1090 across the second plurality of trenches. The device 1000 can further include a second insulator layer 1092 and a second plurality of interconnects 1094. The second insulator layer 1092 can be disposed between the first and second reference magnetic layers 1005, 1040, the first and second tunnel barrier layers 1010, 1045, and the first and second free magnetic layers 1015, 1050. The second plurality of interconnects 1094 can be coupled between the first and second conductive layers 1025, 1060 and the optional first and second magnetic capping layers 1020, 1055. The second plurality of interconnects 1094 can be configured to couple corresponding MTJs in a given row and column position in strings.

The device 1000 can further include bit lines 1096, 1098 disposed on a second side of the first and second reference magnetic layer 1005, 1040, and across one or more of the first and second plurality of insulator blocks 1065. For example, a first bit line 1096 can be coupled to one or more portions of the first reference magnetic layer 1005, and isolated from the first free magnetic layer 1015, the optional first non-magnetic capping layer 1020 and the first conductive layer 1025 by one or more of the first plurality of insulator blocks. A second bit line 1098 can be coupled to one or more portions of the second reference magnetic layer 1040, and isolated from the second free magnetic layer 1050, the optional second non-magnetic capping layer 1055 and the second conductive layer 1060 by one or more of the second plurality of insulator blocks 1065.

Although FIG. 10 illustrates a device 1000 including two levels of MTJ cells, the device can further include MTJ cells in any number of levels. The device 1000 can further include a plurality of select elements, a plurality of source lines and a plurality of word lines as illustrated in FIG. 5. Strings of the MTJ cells arranged along columns and rows can be coupled by a corresponding select transistor to a respective source line. The gate of the select transistors can be coupled to a respective word line.

In one implementation, the reference magnetic layers 1005, 1040 can include one or more layers of a Cobalt-Iron-Boron (Co—Fe—B) alloy, a Cobalt-Iron (CoFe) alloy, a Cobalt-Iron-Nickel (CoFeNi) alloy, an Iron-Nickel (FeNi) alloy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi), or compounds thereof, with a thickness of approximately 1-20 nm, preferably 1 to 10 nm, and more preferably 1 to 5 nm. The tunnel insulator layers 1010, 1045 can include one or more layers of a Magnesium Oxide (MgO), Silicon Oxide (SiOx), Aluminum Oxide (AlOx), Titanium Oxide (TiOx) or combination of these oxide materials with a thickness of approximately 0.2 to 2.0 nm. The free magnetic layers 1015, 1050 can include one or more layers of a Cobalt-Iron-Boron (Co—Fe—B), Cobalt-Nickle-Iron (CoNiFe), Nickle-Iron (NiFe) alloy or their multilayer combinations with a thickness of approximately 1-10 nm, and preferably 1 to 5 nm. The non-magnetic capping layers 1020, 1055 can include one or more layers of metal protecting layers that can include one or more elements of a Tantalum (Ta), Chromium (Cr), Tungsten (W), Vanadium (V), Platinum (Pt), Ruthenium (Ru), Palladium (Pd), Copper (Cu), Silver (Ag), Rhodium (Rh), or their alloy, with a thickness of approximately 1 to 5 nm. The conductive layers 1025, 1060 can include one or more layers of Copper (Cu), Aluminum (Al), Ruthenium (Ru), and/or one or more alloys thereof with a thickness of approximately 5-20 nm.

In one implementation, the walls of the one or more trenches can have a taper of approximately 10-45 degrees from the second side of the reference magnetic layers 1005, 1040 to the first side of the reference magnetic layers 1005, 1040. In another expression, the wall angle measured from the normal axis to the horizontal direction of the reference magnetic layers 1005, 1040 can be approximately 10-45 degrees.

In aspects, the magnetic field of the reference magnetic layers 1005, 1040 can have a fixed polarization substantially parallel to a major planar orientation of the reference magnetic layers 1005, 1040, and the magnetic field of the free magnetic layers 1015, 1050 can have a polarization substantially parallel to the major planar orientation of the reference magnetic layers 1005, 1040, as illustrated in FIG. 3. The magnetic field of a given portion the free magnetic layers 1015, 1050 can be selectively switchable between being substantially parallel and substantially antiparallel to the magnetic field of the reference magnetic layers 1005, 1040. In one implementation, the magnetic field in a given portion of the first free magnetic layer 1015 can be configured to switch to being substantially parallel to the magnetic field of the first reference layer 1005 in response to a current flow in a first direction through a corresponding portion of the first conductive layer 1025, and to switch to being substantially anti-parallel to the magnetic field of the first reference layer 1005 in response to a current flow in a second direction through the corresponding portion of the first conductive layer 1025. Similarly, the magnetic field in a given portion of the second free magnetic layer 1050 can be configured to switch to being substantially parallel to the magnetic field of the second reference layer 1040 in response to a current flow in a first direction through a corresponding portion of the second conductive layer 1060, and to switch to being substantially anti-parallel to the magnetic field of the second reference layer 1040 in response to a current flow in a second direction through the corresponding portion of the second conductive layer 1060. In another implementation, the magnetic field of the reference magnetic layers 1005, 1040 can have a fixed polarization substantially perpendicular to a major planar orientation of the reference magnetic layers 1005, 1040, and the magnetic field of the free magnetic layers 1015, 1050 can have a polarization substantially perpendicular to the major planar orientation of the reference magnetic layers 1005, 1040, as illustrated in FIG. 4.

Figure 11:
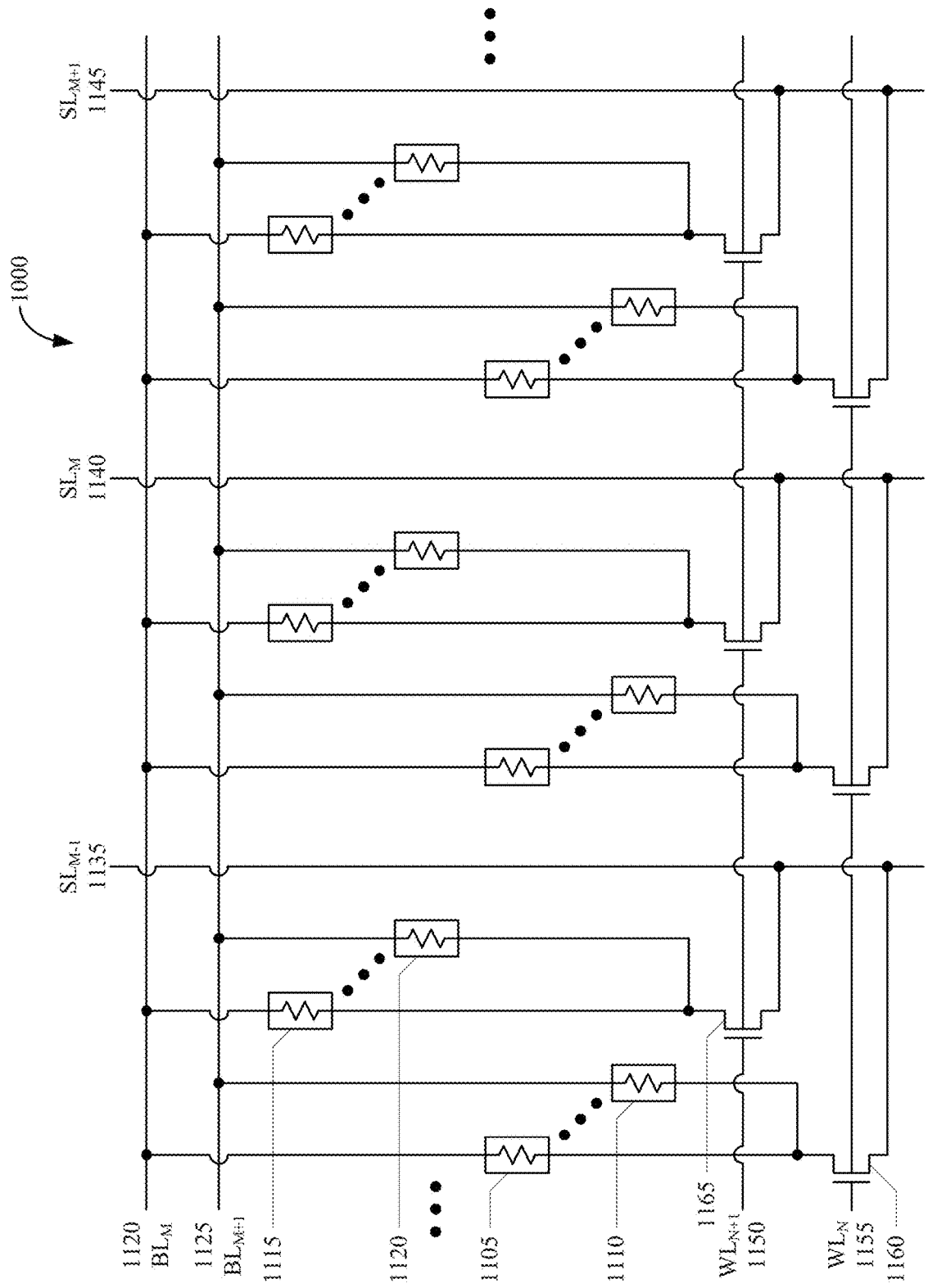
FIG. 11 shows a memory cell array, in accordance with aspects of the present technology.

Referring now to FIG. 11, the memory cell array 1000 can include a plurality of MTJ cells 1105-1120, a plurality of bit lines 1125, 1130, a plurality of source lines 1135-1145, a plurality of word lines 1150, 1155, and a plurality of select transistor 1160, 1165. The MTJ cells arranged along a string 1105, 1110 can be coupled by a corresponding select transistor 1160 to a respective source line 1135. The MTJ cells arranged along a second string 1115, 1120 in the same column can be coupled by another corresponding select transistor 1165 to the same respective source line 1135. The gate of the select transistors 1160, 1165 can be coupled to a respective word line 1150, 1155. The memory device can further include a plurality of memory cell array blocks, as described above with reference to FIGS. 7 and 9.

In one implementation, a logic '0' state can be written to a given memory cell 1105 by biasing the respective bit line 1120 at a bit line write potential (e.g., $V_{BLW}$), biasing the respective source line 1135 at a ground potential, and driving the respective word line 1155 at a word line write potential (e.g., $V_{WLW}=V_{Hi}$). The word lines for the cells that are not being written to can be biased at a ground potential. In addition, the other source lines 1140, 1145 can be biased at a high potential or held in a high impedance state. The high potential can be equal to the bit line write potential or some portion thereof. A logic '1' state can be written to the given memory cell 1105 by biasing the respective bit line 1120 at a ground potential, biasing the respective source line 1135 at a source line write potential (e.g., $V_{SLW}$), and driving the respective word line 1155 at the word line write potential (e.g., $V_{WLW}=V_{Hi}$). The word lines for the cells that are not being written to can be biased at ground potential. In addition, the other source lines 1140, 1145 can be biased at a low potential or held in a high impedance state. The state of the given memory cell 1105 can be read by biasing the respective bit line 1120 at a bit line read potential (e.g., $V_{BLR}$), biasing the respective source line 1135 at a ground potential, driving the respective word line 1155 at a word line read potential ($V_{WLR}=V_{H1}$), and sensing the resulting current on the respective source line 1135. The word lines for the cells that are not being read can be biased at a ground potential. In addition, the other source lines 1140, 1145 can be biased at a high potential or held in a high impedance state. The high potential can be equal to the bit line read potential or some portion thereof.

Figure 12:
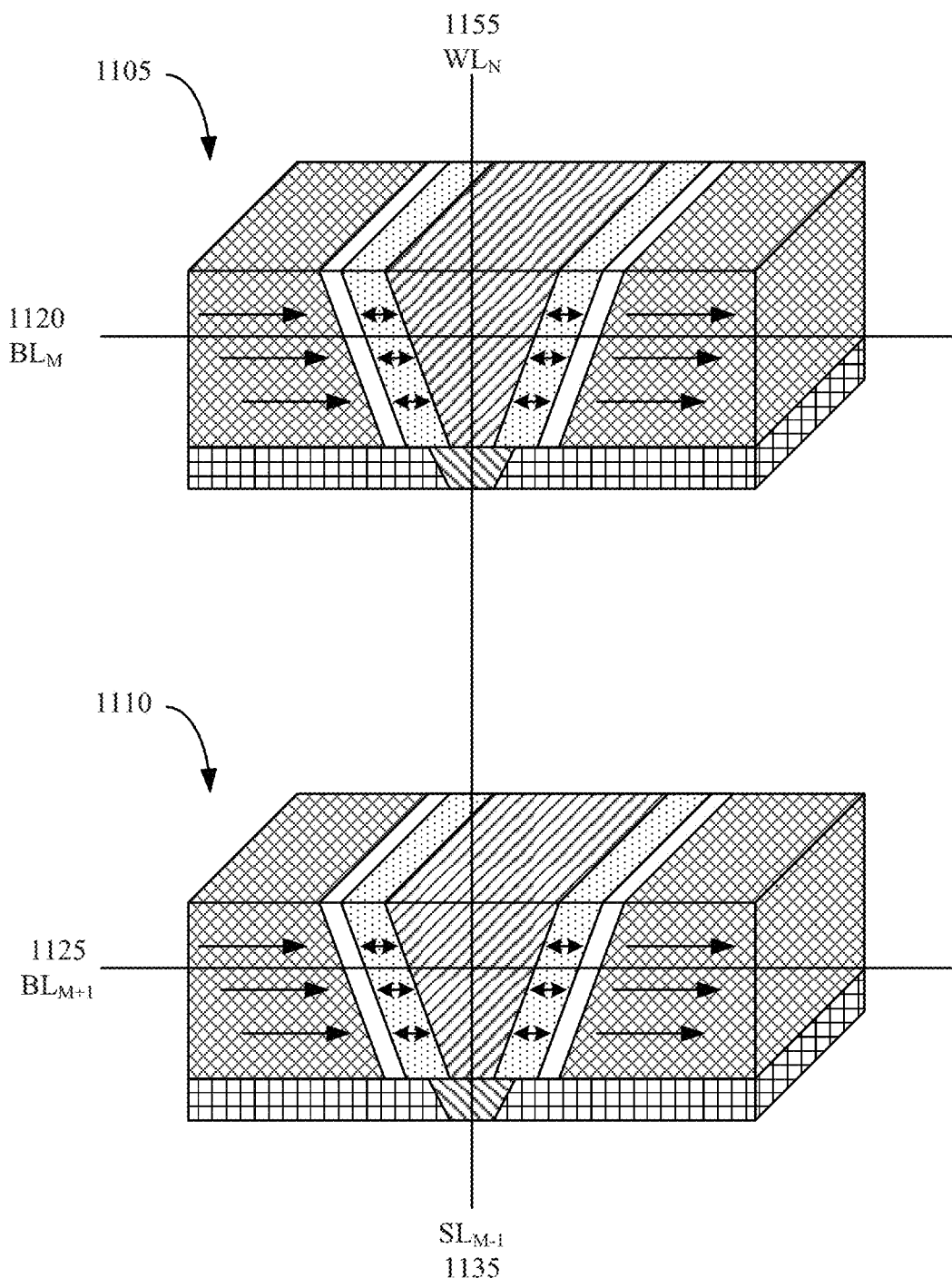
FIG. 12 shows a memory cell array, in accordance with aspects of the present technology.

Referring now to FIG. 12, two MTJ cells coupled in a string, in accordance with aspects of the present technology, is shown. When writing a '0' to a first MTJ cell 1105, the bit line 1120 can be biased at $V_{BLW}$ and the source line can be biased at ground resulting in a current that flows from the bit line 1120 and out through the source line 1135. However, the bit lines of the second MTJ cells in the same string 1110 can be biased at ground, which will result in half the current that flows into the bit line 1120 of the first MTJ cell 1105 flowing out the source line 1135 and half the current leaking out through the bit line 1125 of the second MTJ cell. By increasing the potential voltage on the bit line 1120 of the second MTJ cell 1110 or holding the bit line 1120 of the second MTJ cell 1110 in a high impedance state (e.g., floating), the leakage current can be reduced. For example, if the potential on the bit line 1125 of the second MTJ cell 1110 is increased to one half (½) of the applied to the bit line 1120 of the first MTJ cell 1105, the leakage current out through the second MTJ cell 1110 can be reduced to 25%. Similar leakage paths can be present when writing a '1' to a given MTJ cell in a string. By decreasing the potential applied to the bit lines of the other MTJ cells in the string or holding the bit lines of the other strings in a high impedance state, leakage currents through the other MTJ cells can be also be decreased.

Figure 13A:
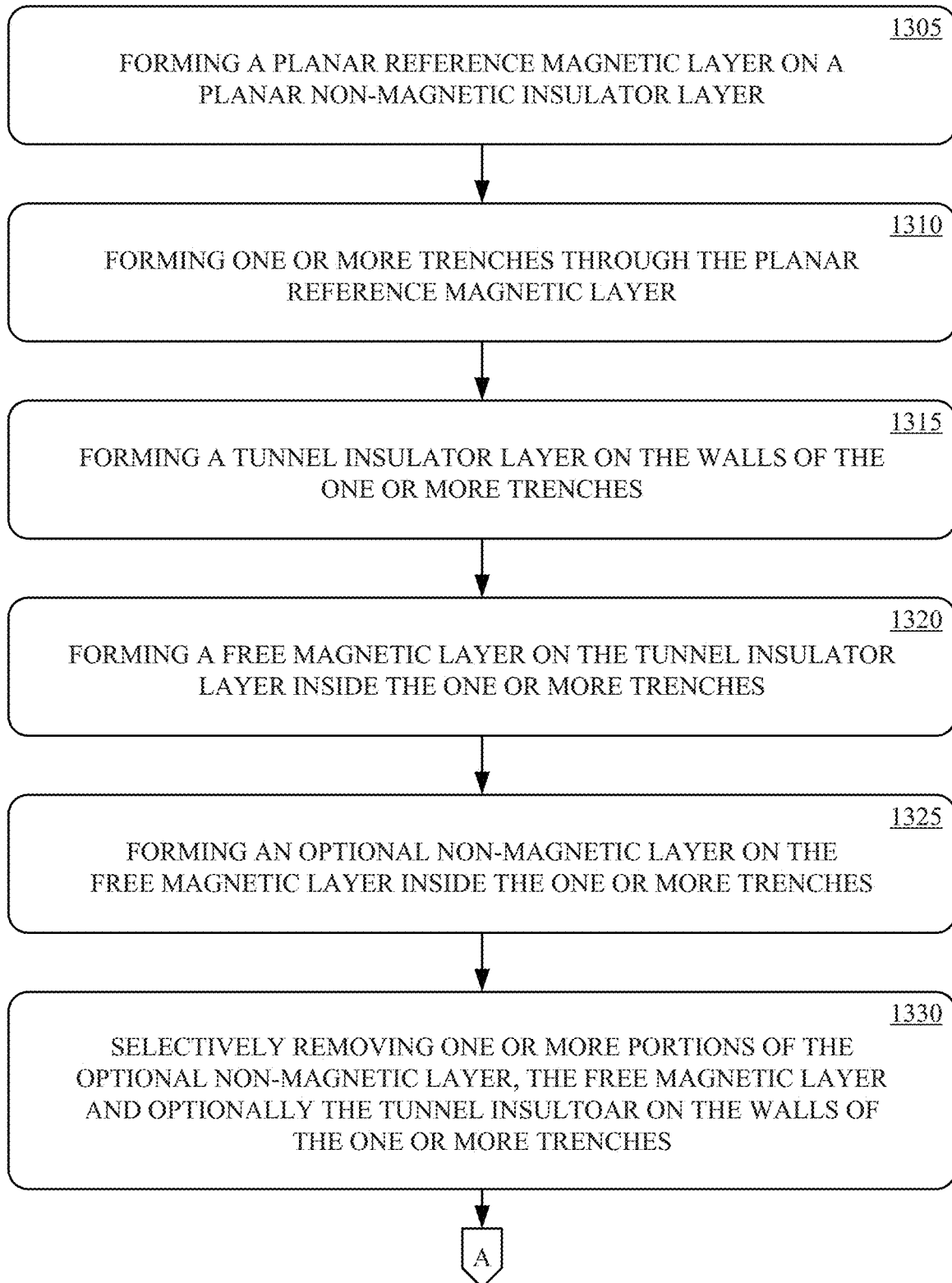
FIGS. 13A and 13B show a method of fabricating a MTJ, in accordance with aspects of the present technology.
Figure 13B:
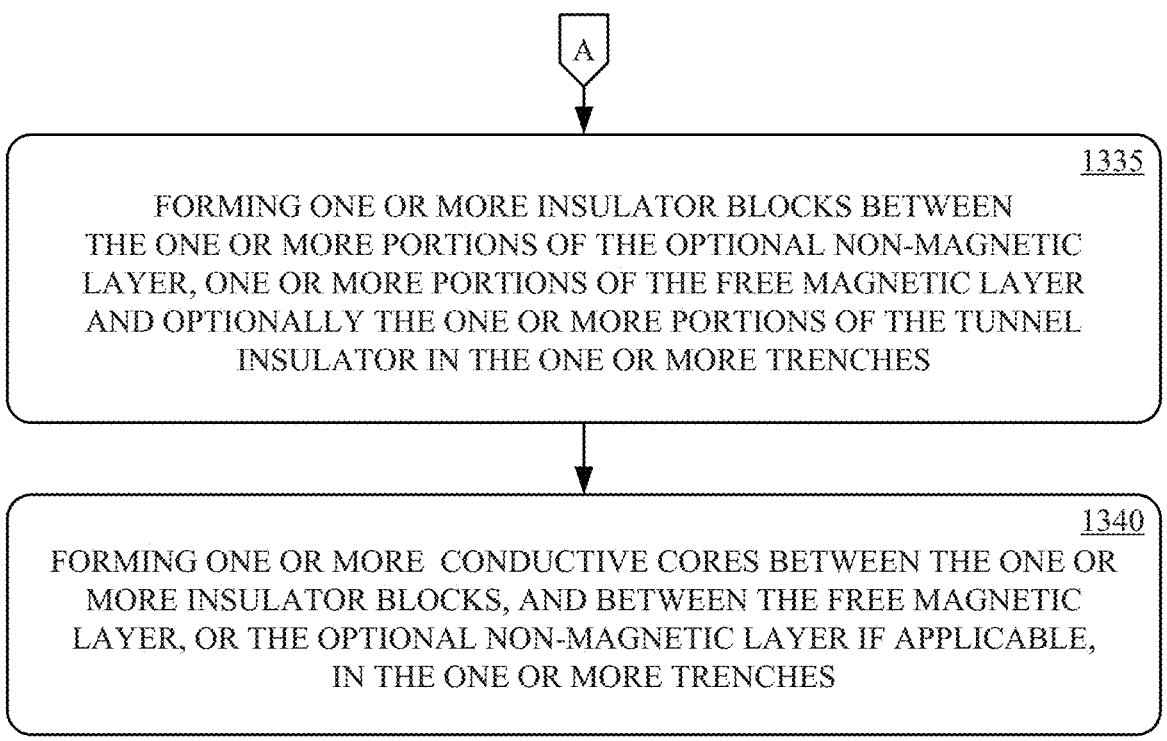

Referring now to FIGS. 13A and 13B, a method of fabricating one or more MTJs, in accordance with aspects of the present technology, is shown. The method of fabricating the one or more MTJs will be further described with reference to FIGS. 14A-14H, which show the one or more MTJs during various stage of the method of manufacturing. The method of fabrication can include forming a planar reference magnetic layer 1405 on a planar non-magnetic insulator layer 1410, at 1305. Although aspects of the present technology are described with reference to layers, it is to be appreciated that the term "layer" as used herein can refer to a uni-layer or a multi-layer. In one implementation, one or more layers Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi), or compounds thereof can be deposited on the non-magnetic insulator layer. In one implementation, the non-magnetic insulator layer can include one or more layers of Magnesium Oxide (MgO), Silicon Oxide (SiOx), Aluminum Oxide (AlOx) or alloys.

At 1310, one or more trenches 1415 can be formed in the reference magnetic layer 1405. In one implementation, the one or more trenches 1415 can be formed by Ion Beam Etching (IBE) in combination with a trench mask. In one implementation, the one or more trenches can have a taper of approximately 10-45 degrees from a top side of the reference magnetic layer 1405 to a bottom side of the reference magnetic layer 1405. In another expression, the wall angle measured from the normal axis to the horizontal direction of the planar reference magnetic layer 1405 can be approximately 10-45 degrees.

At 1315, a tunnel insulator layer 1420 can be formed on the walls of the one or more trenches 1415. At 1320, a free magnetic layer 1425 can be formed on the tunnel insulator in the one or more trenches 1415. At 1325, an optional non-magnetic layer (not shown) can be formed on the free magnetic layer 1425 in the one or more trenches 1415. In one implementation, a tunnel insulator layer 1420 can be deposited on the surface of the planar non-magnetic insulator layer 1405 including the walls of the one or more trenches 1415. The tunnel insulator layer can include one or more layers of a Magnesium Oxide (MgO), Silicon Oxide (SiOx), Aluminum Oxide (AlOx), Titanium Oxide (TiOx) or a combination of these oxide materials. A free magnetic layer 1425 can be deposited on the surface of the tunnel insulator layer 1420 inside and outside the one or more trenches 1415. The free magnetic layer 1425 can include one or more layers of a Cobalt-Iron-Boron (Co—Fe—B), Cobalt-Nickle-Iron (CoNiFe), Nickle-Iron (NiFe) alloy or their multilayer combinations. A non-magnetic layer can be deposited on the surface of the free magnetic layer 1425 inside and outside of the one or more trenches 1415. The non-magnetic layer can include one or more layers a Tantalum (Ta), Chromium (Cr), W, V, Pt, Ru, Pd, Cu, Ag, Rh, or their alloy. The materials of the tunnel insulator 1420, the free magnetic layer 1425 and the optional non-magnetic layer can be deposited by an angular deposition process to improve deposition in the one or more trenches. In other implementations, the materials of the tunnel insulator 1420, the free magnetic layer 1425 and the optional non-magnetic layer can be deposited by atomic layer deposition or Chemical Vapor Deposition (CVD). The portions of the tunnel insulator layer 1420, the free magnetic layer 1425 and the optional annular non-magnetic layer at the bottom of the one or more trenches 1415 and on top of the planar non-magnetic insular layer 1405 can be removed by one or more selective etching, milling or the like processes. Alternatively, the portions of the tunnel insulator layer 1420, the free magnetic layer 1425 and the optional non-magnetic layer at the bottom of the one or more trenches and on top of the planar non-magnetic insular layer can be removed by successive etching, milling or the like processes before the subsequent layer is deposited.

Figure 14A:
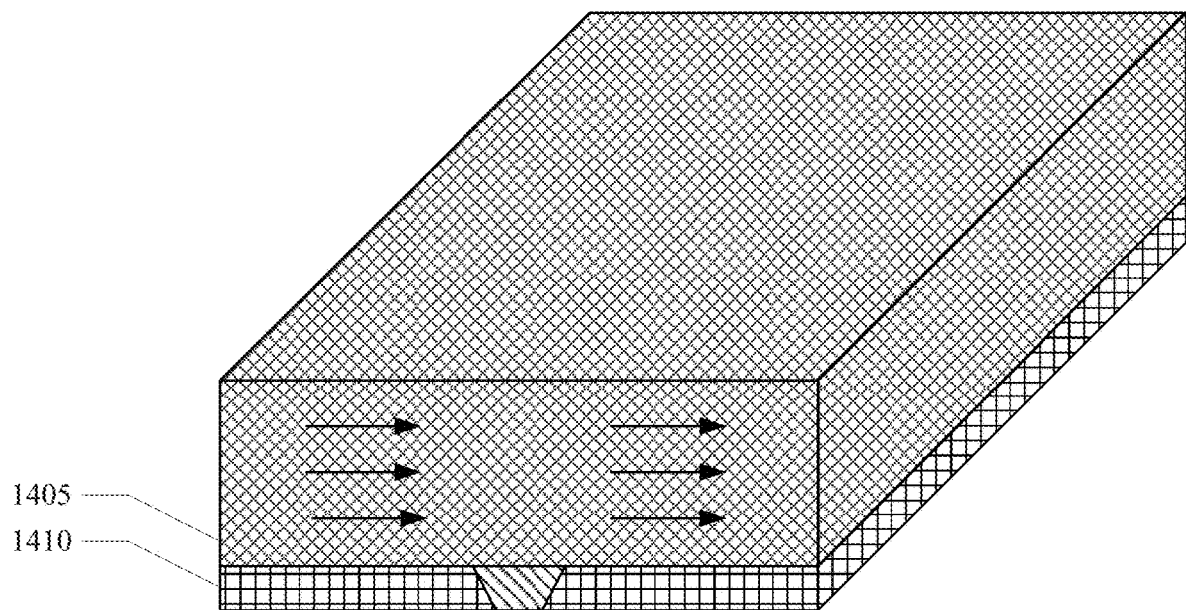
FIGS. 14A-14H shows a method of fabricating a MTJ, in accordance with aspects of the present technology.
Figure 14B:
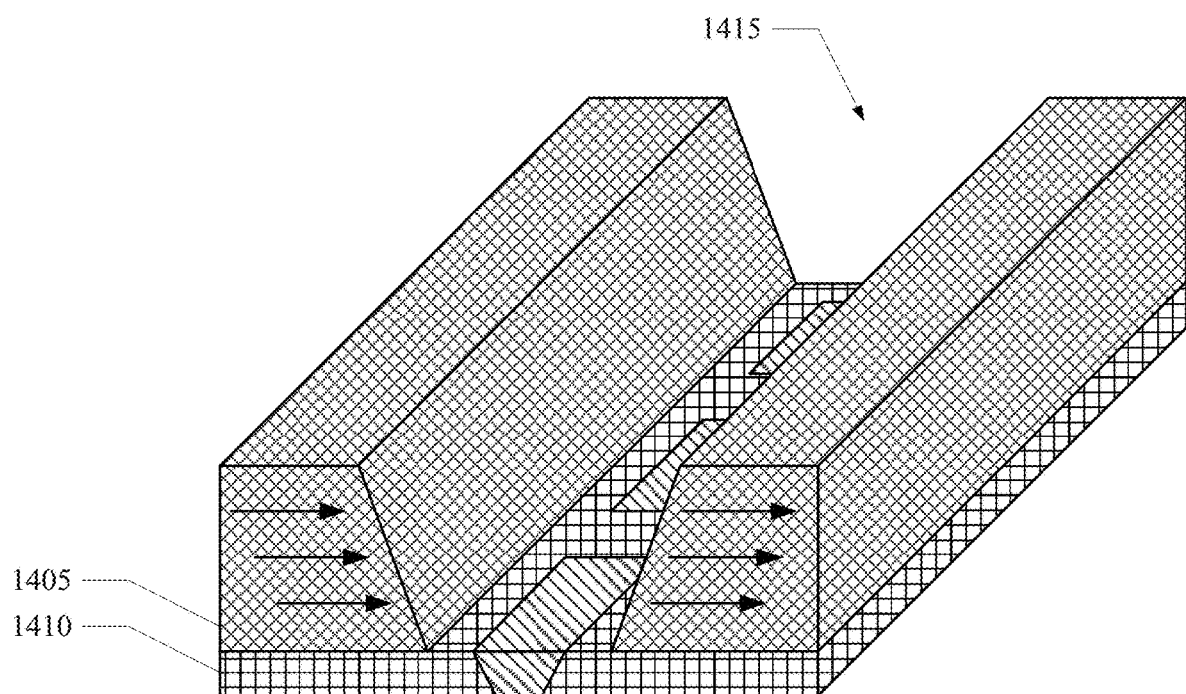
Figure 14C:
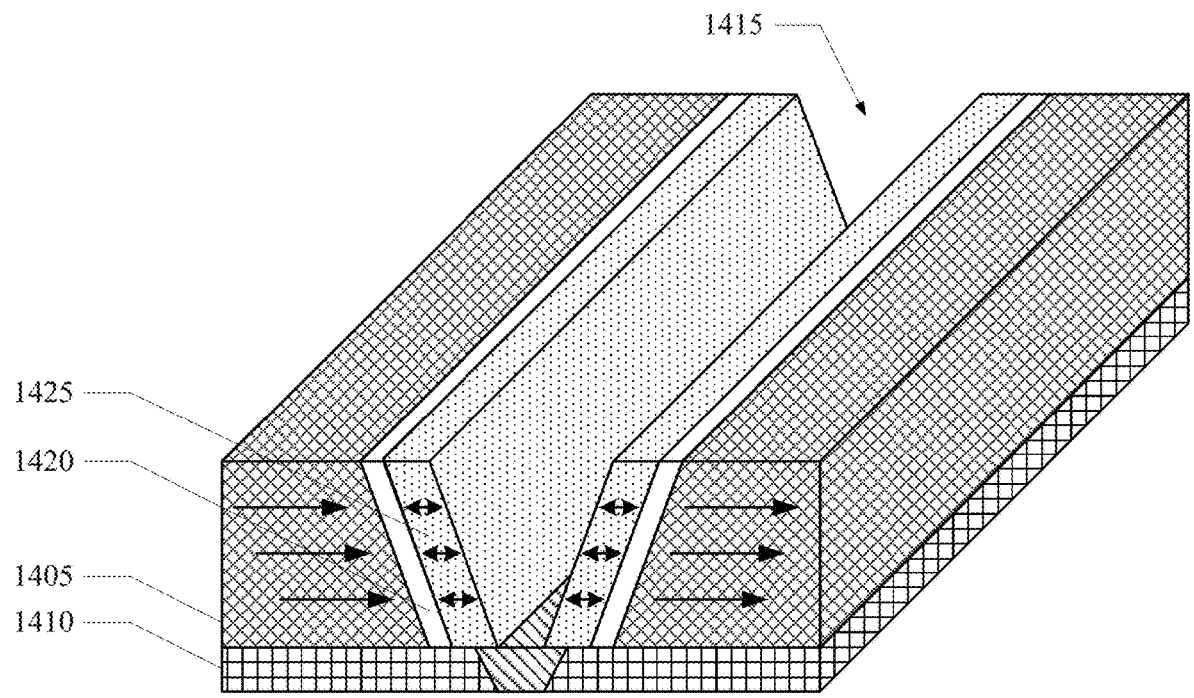

In one implementation, the magnetic field of the planar reference magnetic layer 1405 and the magnetic field of the free magnetic layer 1425 can have a polarization parallel to the major planar orientation of the planar reference magnetic layer 1405 (also referred to as in-plane), and the magnetic field of the free magnetic layer 1425 can be selectively switchable between being substantially parallel and substantially antiparallel to the magnetic field of the planar reference layer 1425, as illustrated in FIG. 14C. In another implementation, the magnetic field of the planar reference magnetic layer 1405 and the magnetic field of the free magnetic layer 1425 can have a polarization substantially perpendicular to the major planar orientation of the planar reference magnetic layer 1405 (also referred to as perpendicular-to-plane), and the magnetic field of the free magnetic layer 1425 can be selectively switchable between being substantially parallel and substantially antiparallel to the magnetic field of the planar reference layer 1405, as illustrated in FIG. 4.

Figure 14D:
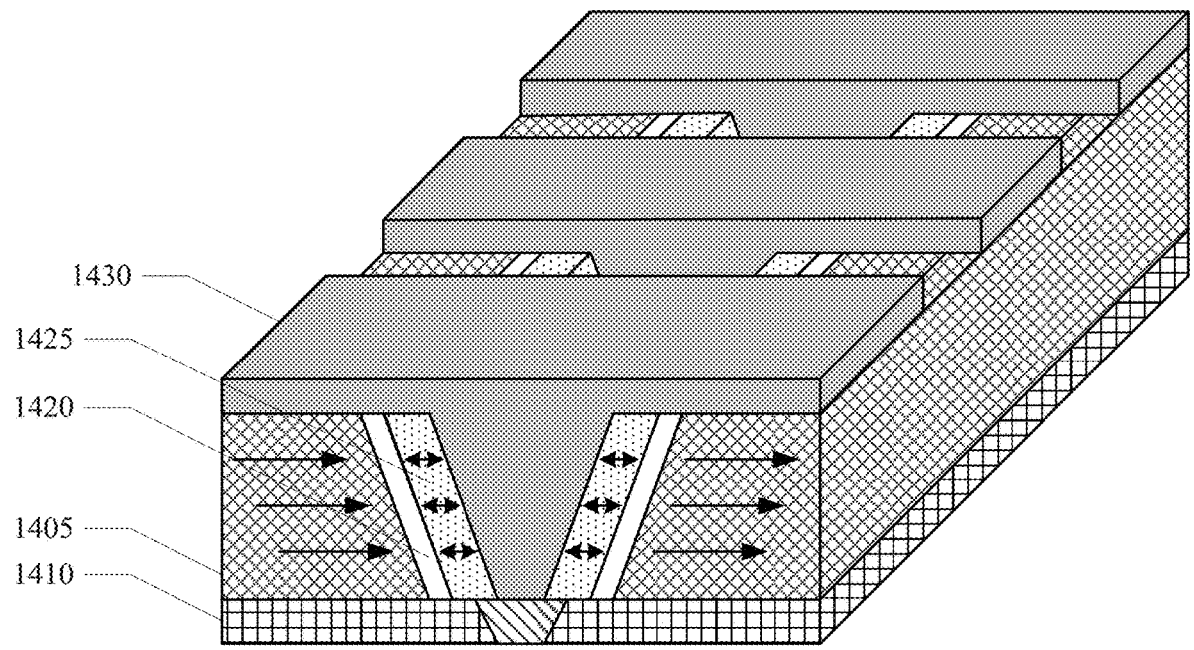
Figure 14E:
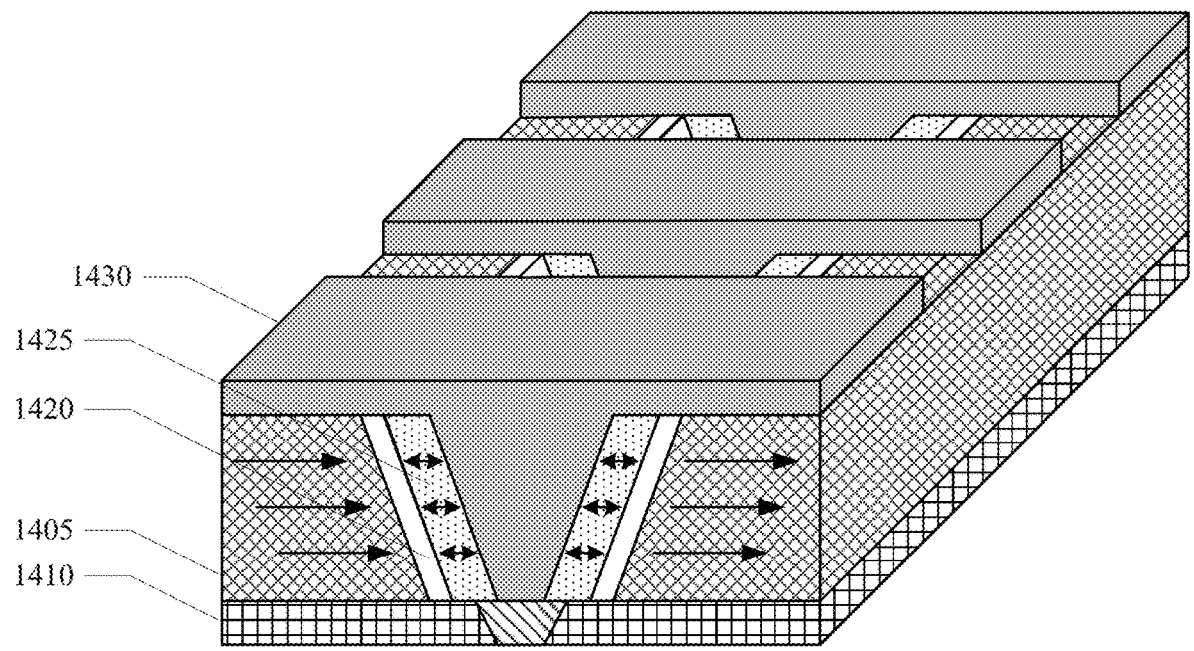

At 1330, one or more portions of the optional non-magnetic layer, one or more portions of the free magnetic layer 1425, and optionally one or more portions of the tunnel insulator layer 1420 can be removed from the walls of the one or more trenches 1415. In one implementation, an insulator block mask 1430 can be formed as illustrated in FIG. 14D, and the exposed portions of the optional non-magnetic layer, the free magnetic layer 1425, and optionally the tunnel insulator layer 1420 can be removed by ion beam milling, reactive ion etch or the like, as illustrated in FIG. 14E. In other implementation, the exposed portions of the optional non-magnetic layer and the free magnetic layer can be oxidized and nitride. In yet another implementation can be ion implanted with Gallium (Ga) or the like.

Figure 14F:
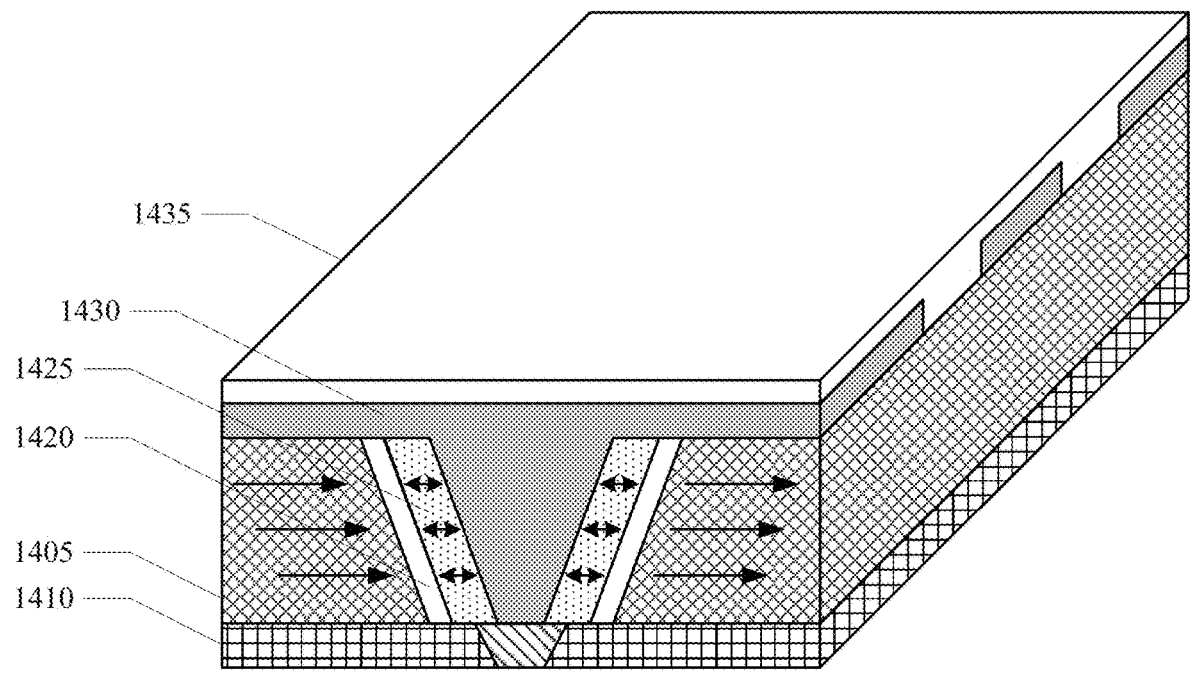
Figure 14G:
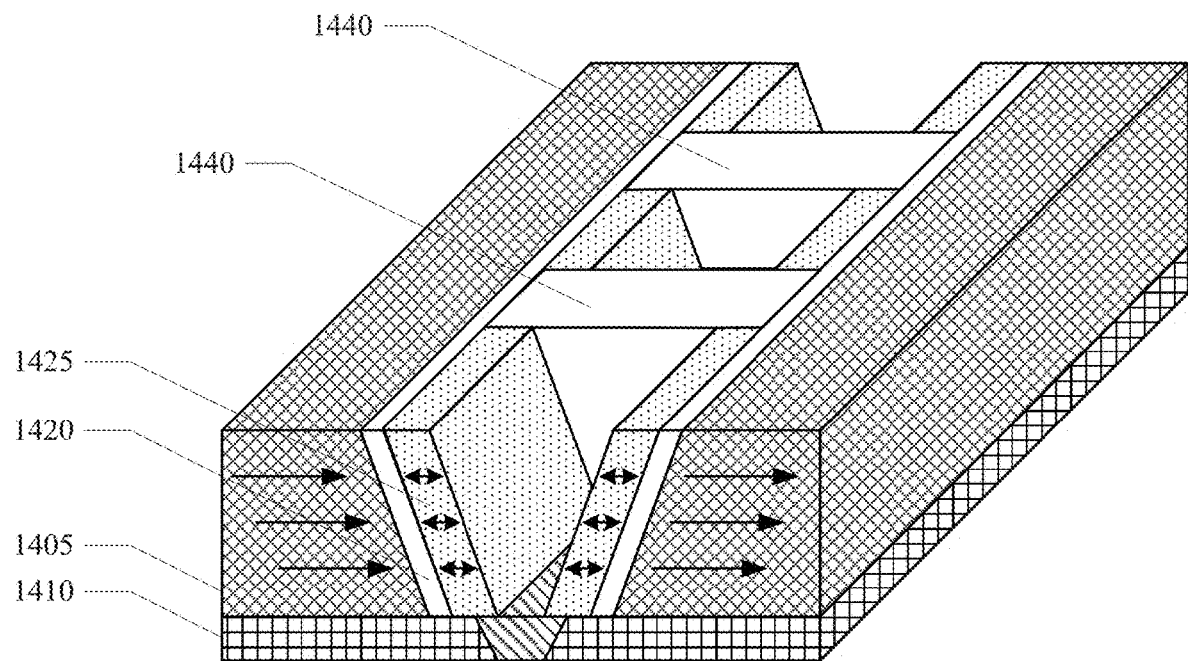

At 1335, one or more insulator blocks can be formed between the one or more portions of the optional non-magnetic layer, the one or more portions of the free magnetic layer 1425 and optionally the one or more portions of the tunnel insulator 1420 in the one or more trenches. In one implementation, a layer of an insulator 1435 such a Magnesium Oxide (MgO), Silicon Oxide (SiOx), Aluminum Oxide (AlOx), Titanium Oxide (TiOx) or a combination of these oxide materials can be deposited. The insulator layer 1435 can be deposited in the portions of the one or more trenches exposed by the insulator block mask 1430 and over the surface of the insulator block mask 1430, as illustrated in FIG. 14F. In one implementation, a processes such as Chemical Mechanical Polishing (CMP) can be used to remove the excess portion of the one or more insulator layers outside the exposed portions of the one or more trenches, and then a resist stripping process can be utilized to remove the insulator block mask, as illustrated in FIG. 14G.

Figure 14H:
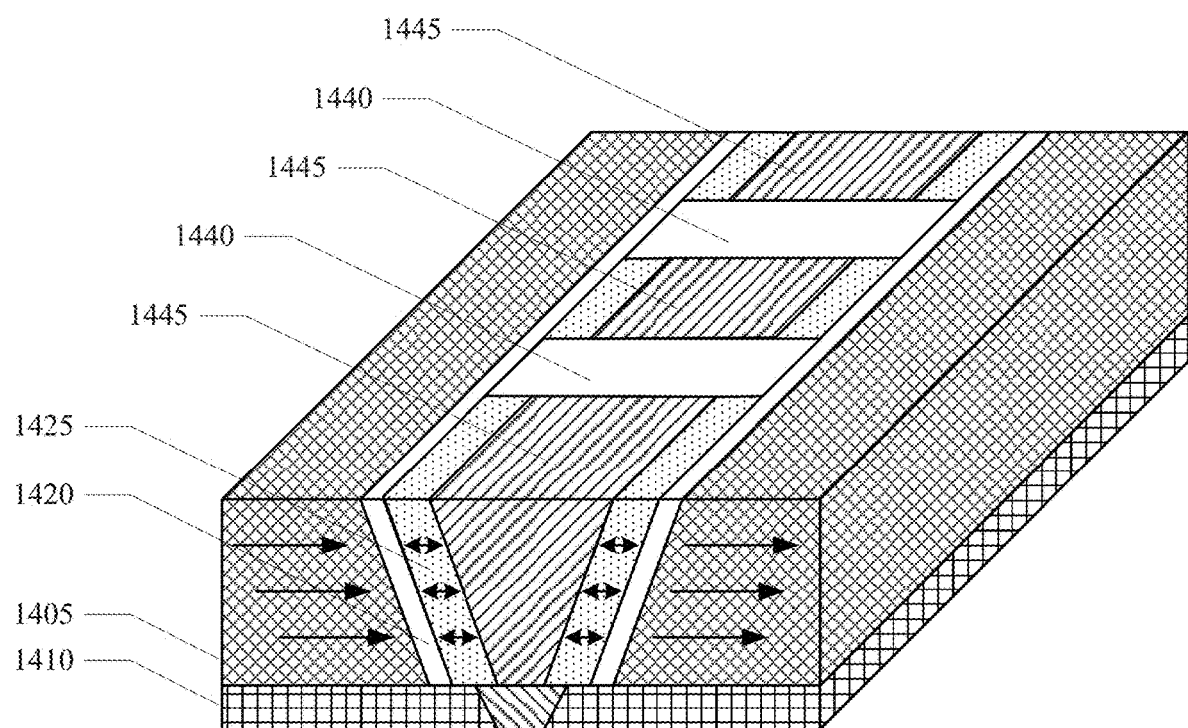

At 1340, one or more conductive cores 1445 can be formed between the one or more insulator blocks 1440, and between the one or more portions of the free magnetic layer 1425, or the optional non-magnetic layer if applicable, in the one or more trenches, as illustrated in FIG. 14H. In one implementation, a metal seed layer can be deposited on the exposed portions of the free magnetic layer, or the optional non-magnetic layer if applicable, between the one or more insulator blocks. A conductor layer, such as Copper (Cu) can be deposited by a process such as Chemical Vapor Deposition (CVD) on the metal seed layer to form the one or more conductive cores.

The respective portions of the reference magnetic layer 1405, the tunnel insulator 1420, the free magnetic layer 1425, the optional non-magnetic layer and the conductive cores 1445 between sets of insulator blocks 1440 form corresponding MTJ cells. In addition, the processes of 1305-1340 can optionally be repeated a plurality of times to form strings of MTJs as illustrated in FIG. 10.

Figure 15A:
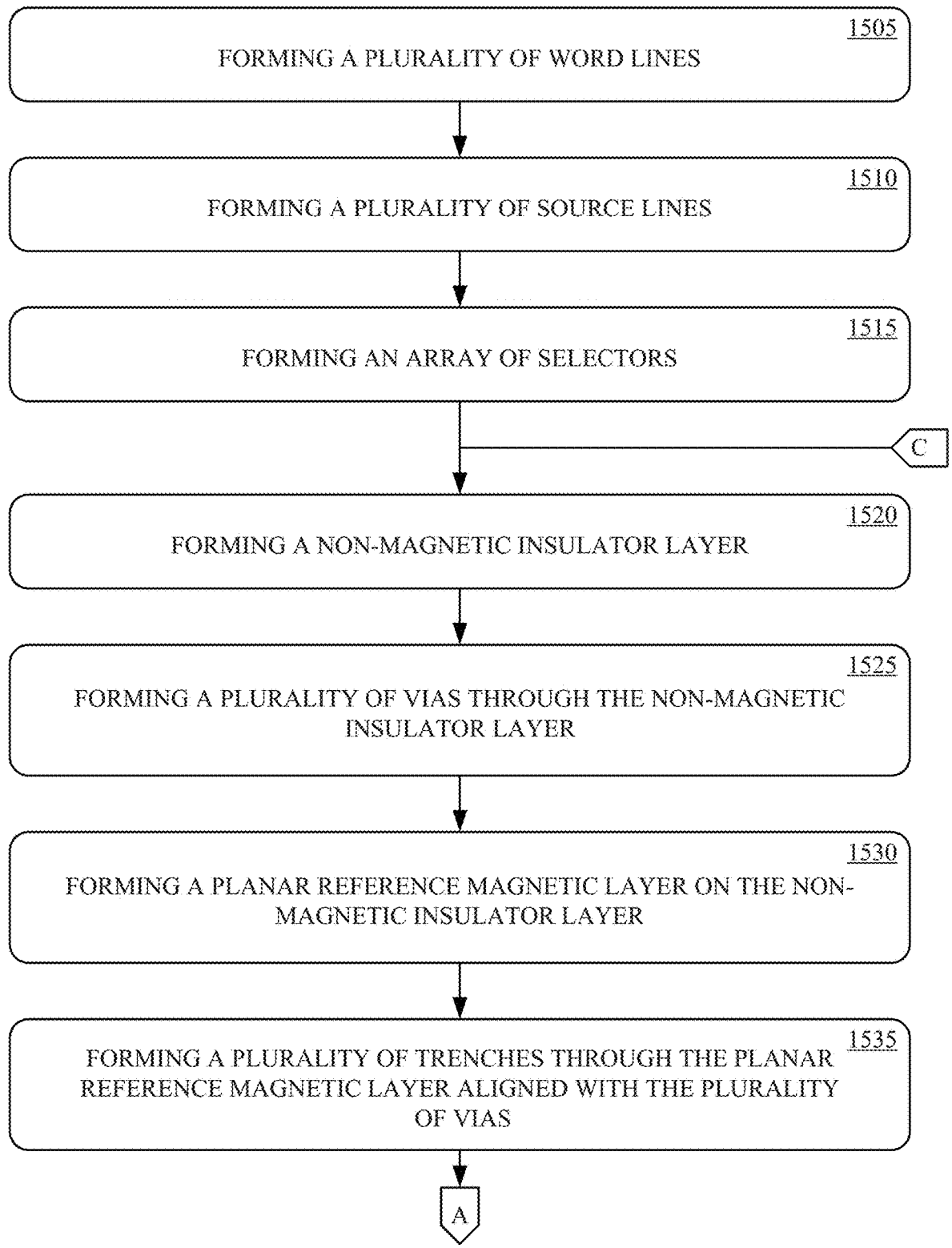
FIGS. 15A-15C shows a method of fabricating a MTJ, in accordance with aspects of the present technology.
Figure 15B:
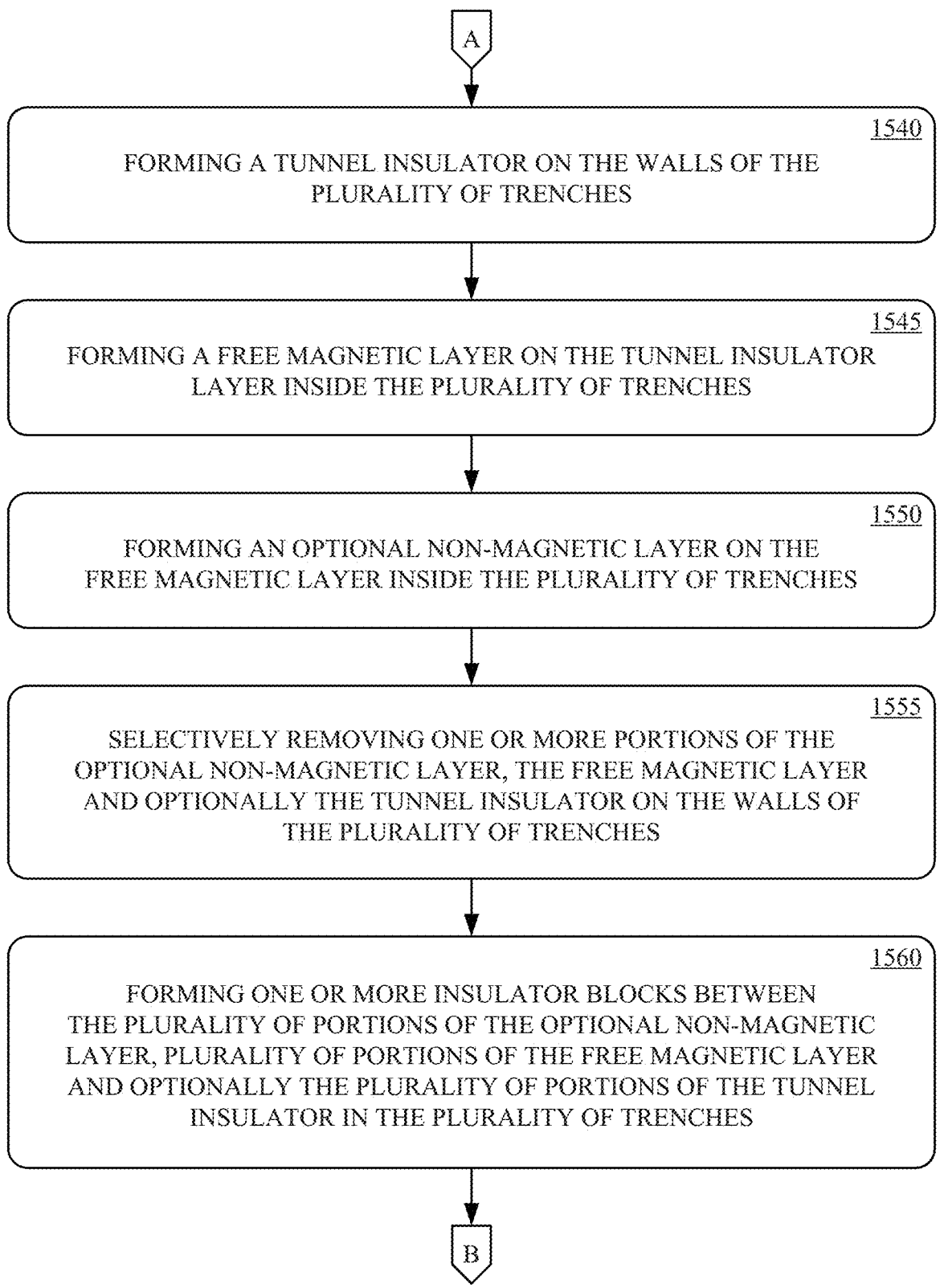
Figure 15C:
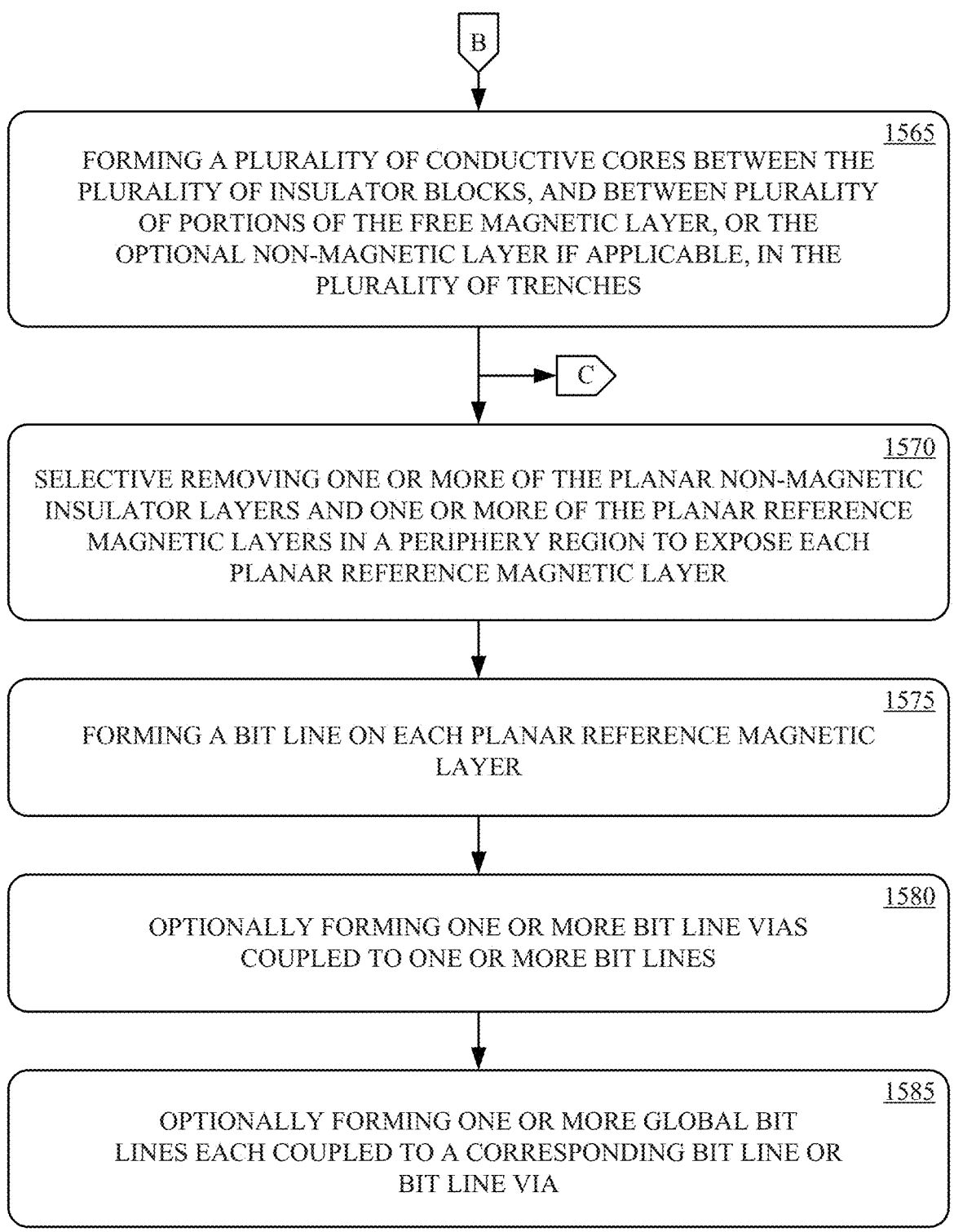

Referring now to FIGS. 15A-15C, a method of fabricating a memory cell array, in accordance with aspects of the present technology, is shown. The method of fabricating the memory cell array will be further described with reference to FIGS. 16A-16F, which show the memory cell array during various stage of the method of manufacturing. The method of fabrication can include forming an array of selectors 1602 on a substrate, at 1505. There a numerous selectors and methods of fabrication that can be utilized for the array of selectors. The specific selector and processes are not germane to an understanding of aspects of the present technology and therefore will not be described in further detail.

At 1510, a plurality of word lines 1604 can be formed on a substrate and coupled to the selectors in respective rows. In one implementation, a conductive layer can be deposited on a substrate. A word line pattern mask can be formed on the conductive layer and a selective etching process can be performed to remove the portions of the conductive layer exposed by the word line pattern mask to form the plurality of word lines coupled to the selectors. In another embodiment, a word line can be formed by electro-plating on to the framed photo-resist pattern that has a vacancy for word line portion. The word lines can be disposed as a plurality of substantially parallel traces in a first direction (e.g., rows) of the substrate. There are numerous conductive materials that can be utilized for the word lines, and there are numerous deposition, masking, etching, photoresist-framing, and electro-plating process that can be utilized for forming the plurality of word lines. The specific materials and processes are not germane to an understanding of aspects of the present technology and therefore will not be described in further detail.

At 1515, a plurality of source lines 1606 can be formed on the substrate and coupled to the selectors in respective columns. In one implementation, an insulator layer can be formed over the plurality of word lines, and a second conductive layer can be deposited over the insulator layer. A source line pattern mask can be formed on the second conductive layer a selective etching process can be performed to remove the portions of the second conductive layer exposed by the word line pattern mask to form the plurality of source lines. The source lines can be disposed as a plurality of substantially parallel traces in a second direction (e.g., columns) on the substrate that is perpendicular to the first direction of the word lines. There are numerous conductive materials that can be utilized for the source lines, and there are numerous deposition, masking, etching, photoresist-framing, and electro-plating process that can be utilized for forming the plurality of source lines. The specific materials and processes are not germane to an understanding of aspects of the present technology and therefore will not be described in further detail.

At 1520, one or more planar non-magnetic insulator layers 1608 can be deposited on the plurality of selectors. In one implementation, one or more layers of Magnesium Oxide (MgO), Silicon Oxide (SiOx), Aluminum Oxide (AlOx) or alloys thereof can be deposited on the plurality of selectors. At 1525, a plurality of vias 1610 can be formed through the first planar non-magnetic insulator layer. There are numerous conductive materials that can be utilized for the plurality of vias through the one or more planar non-magnetic insulator layer, and there are numerous deposition, masking, and etching process that can be utilized for forming the plurality of vias. The specific materials and processes are not germane to an understanding of aspects of the present technology and therefore will not be described in further detail.

At 1530, one or more planar reference magnetic layers 1612 can be deposited on the one or more non-magnetic insulator layers 1610. In one implementation, one or more layers Cobalt-Iron-Boron (Co—Fe—B) alloy, a Cobalt-Iron (CoFe) alloy, a Cobalt-Iron-Nickle (CoFeNi) alloy, an Iron-Nickle (FeNi) alloy, an Iron-Boron (FeB) alloy, a multilayer of Cobalt-Platinum (CoPt) and Cobalt Paradium (CoPd), a Heusler Alloy selected from Cobalt-Manganese-Silicon (CoMnSi), Cobalt-Manganese-Germanium (CoMnGe), Cobalt-Manganese-Aluminum (CoMnAl), Cobalt-Manganese-Iron-Silicon (CoMnFeSi), Cobalt-Iron-Silicon (CoFeSi), Cobalt-Iron-Aluminum (CoFeAl), Cobalt-Chromium-Iron-Aluminum (CoCrFeAl), Cobalt-Iron-Aluminum-Silicon (CoFeAlSi), or compounds thereof can be deposited on the one or more non-magnetic insulator layers.

At 1535, a plurality of trenches 1614 can be formed through the one or more reference magnetic layers 1612. The trenches 1614 can be aligned the plurality of vias 1610 In one implementation, the one or more trenches can be formed by Ion Beam Etching (IBE) in combination with a trench mask. In one implementation, the one or more trenches can have a taper of approximately 10-45 degrees from a top side of the reference magnetic layer to a bottom side of the reference magnetic layer. In another expression, the wall angle measured from the normal axis to the horizontal direction of the planar reference magnetic layer can be approximately 10-45 degrees.

At 1540, a plurality of portions of tunnel insulators can be formed on the walls of the one or more trenches. At 1545, a plurality of portions of free magnetic layer can be formed on the plurality of portions of tunnel insulators in the plurality of trenches. At 1550, a plurality of portions of optional non-magnetic layer can be formed on the free magnetic layer in the one or more trenches. In one implementation, a tunnel insulator layer 1616 can be deposited on the surface of the planar non-magnetic insulator layer 1612 and the walls of the one or more trenches 1614. The tunnel insulator layer 116 can include one or more layers of a Magnesium Oxide (MgO), Silicon Oxide (SiOx), Aluminum Oxide (AlOx), Titanium Oxide (TiOx) or a combination of these oxide materials. A free magnetic layer 1618 can be deposited on the surface of the tunnel insulator layer 1616 inside and outside the one or more trenches 1614. The free magnetic layer 1618 can include one or more layers of a Cobalt-Iron-Boron (Co—Fe—B), Cobalt-Nickle-Iron (Co-NiFe), Nickle-Iron (NiFe) alloy or their multilayer combinations. An optional non-magnetic layer 1620 can be deposited on the surface of the free magnetic layer 1618 inside and outside of the one or more trenches 1614. The non-magnetic layer 1620 can include one or more layers a Tantalum (Ta), Chromium (Cr), W, V, Pt, Ru, Pd, Cu, Ag, Rh, or their alloy. The materials of the tunnel insulator 1616, the free magnetic layer 1618 and the optional non-magnetic layer 1620 can be deposited by an angular deposition process to improve deposition in the one or more trenches 1614. In other implementations, the materials of the tunnel insulator 1616, the free magnetic layer 1618 and the optional non-magnetic layer 1620 can be deposited by atomic layer deposition or Chemical Vapor Deposition (CVD). The portions of the tunnel insulator layer 1616, the free magnetic layer 1618 and the optional non-magnetic layer 1620 at the bottom of the one or more trenches 1614 and on top of the planar reference magnetic layer 1612 can be removed by one or more selective etching, milling or the like processes. Alternatively, the portions of the tunnel insulator layer 1616, the free magnetic layer 1618 and the optional non-magnetic layer 1620 at the bottom of the one or more trenches 1614 and on top of the planar reference magnetic layer 1612 can be removed by successive etching, milling or the like processes before the subsequent layer is deposited. It is to be appreciated that the thickness along a vertical axis of the free magnetic layer 1618 or the optional non-magnetic layer 1620 is thinner in the horizontal portions at the bottom of the trenches 1614 and on top of the planar reference magnetic layer 1612 as compared to the portions along the walls of the trenches 1614. Therefore, the free magnetic layer 1618 or the optional non-magnetic layer 1620 at the bottom of the one or more trenches 1614 and on top of the planar reference magnetic layer 1612 can be removed, while the free magnetic layer 1618 or the optional non-magnetic layer 1620 is only thinned.

In one implementation, the magnetic field of the reference magnetic layer and the magnetic field of the free magnetic layer can have a polarization parallel to the major planar orientation of the planar reference magnetic layer (also referred to as in-plane), and the magnetic field of the free magnetic layer can be selectively switchable between being substantially parallel and substantially antiparallel to the magnetic field of the planar reference layer. In another implementation, the magnetic field of the reference magnetic layer and the magnetic field of the free magnetic layer can have a polarization substantially perpendicular to the major planar orientation of the planar reference magnetic layer (also referred to as perpendicular-to-plane), and the magnetic field of the free magnetic layer can be selectively switchable between being substantially parallel and substantially antiparallel to the magnetic field of the planar reference layer.

Figure 16A:
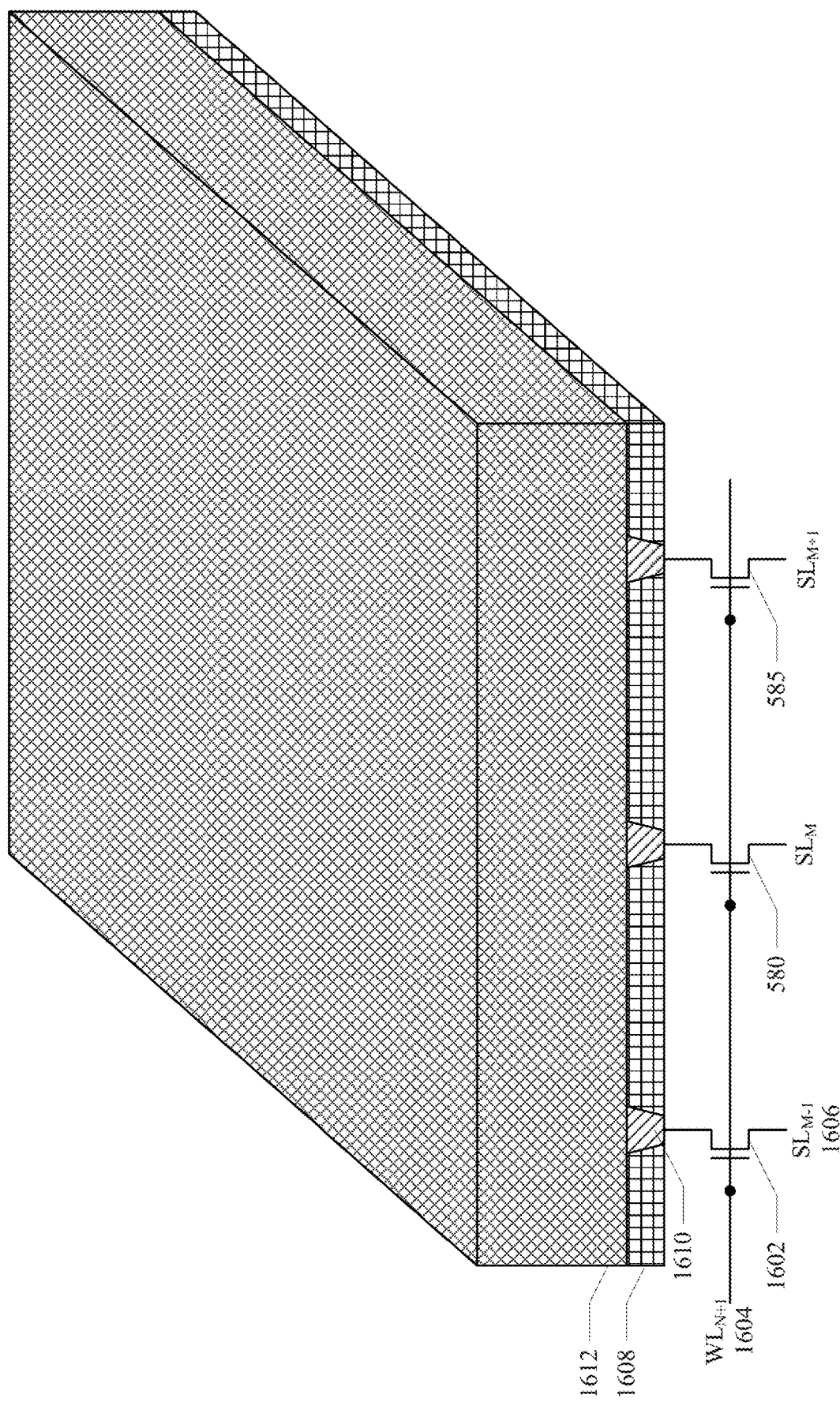
FIGS. 16A-16F shows a method of fabricating a MTJ, in accordance with aspects of the present technology.
Figure 16B:
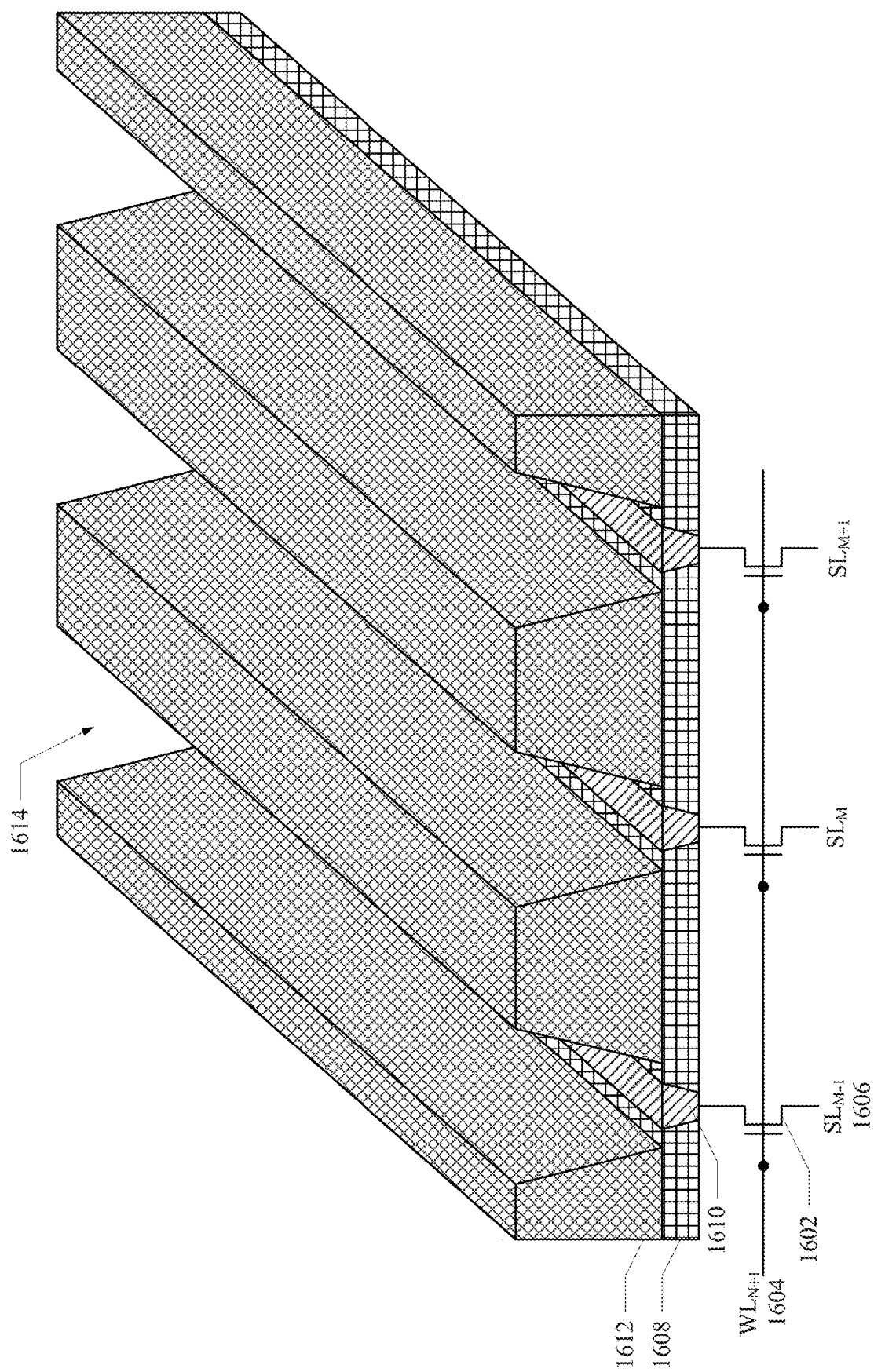
Figure 16C:
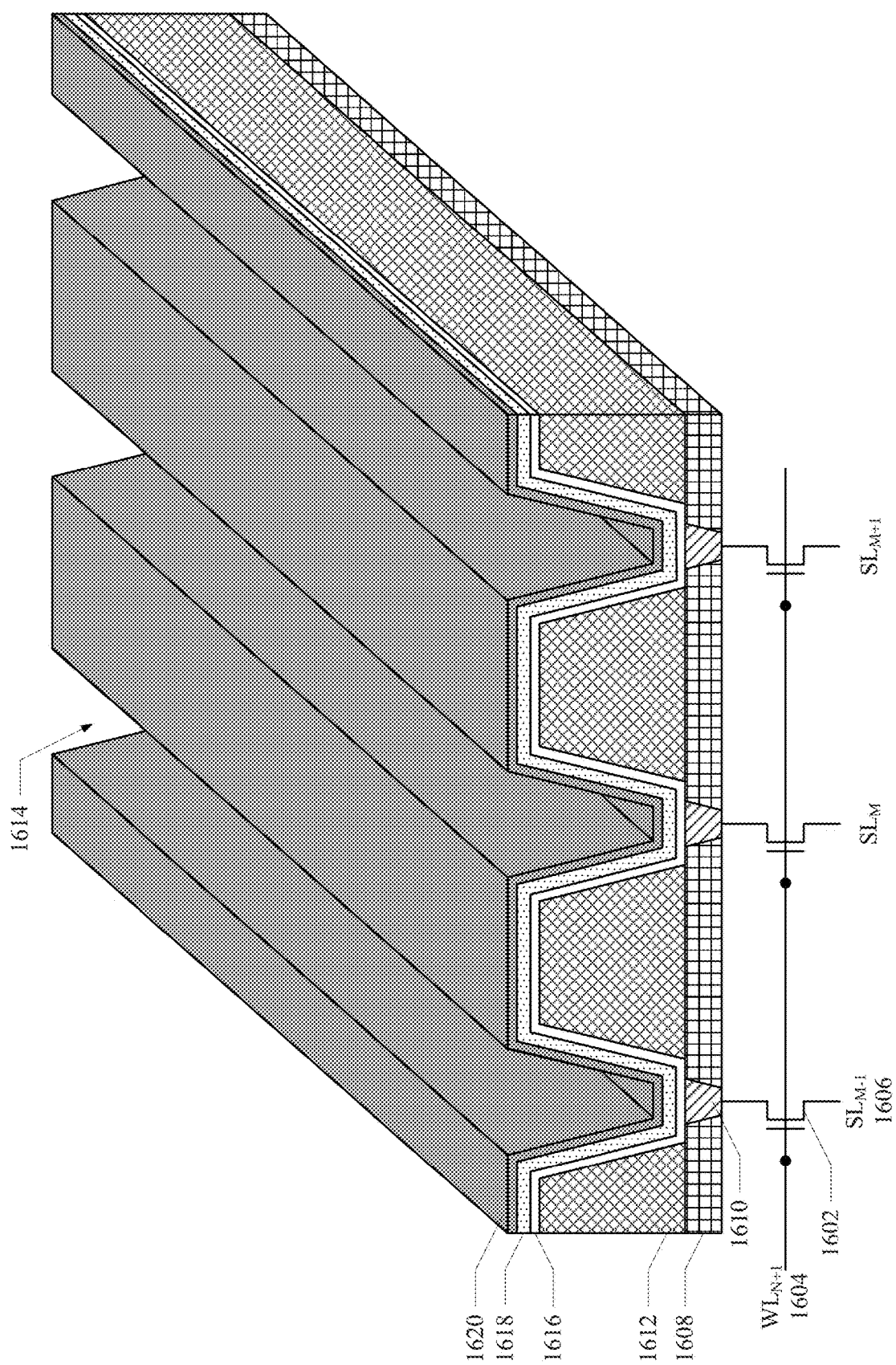
Figure 16D:
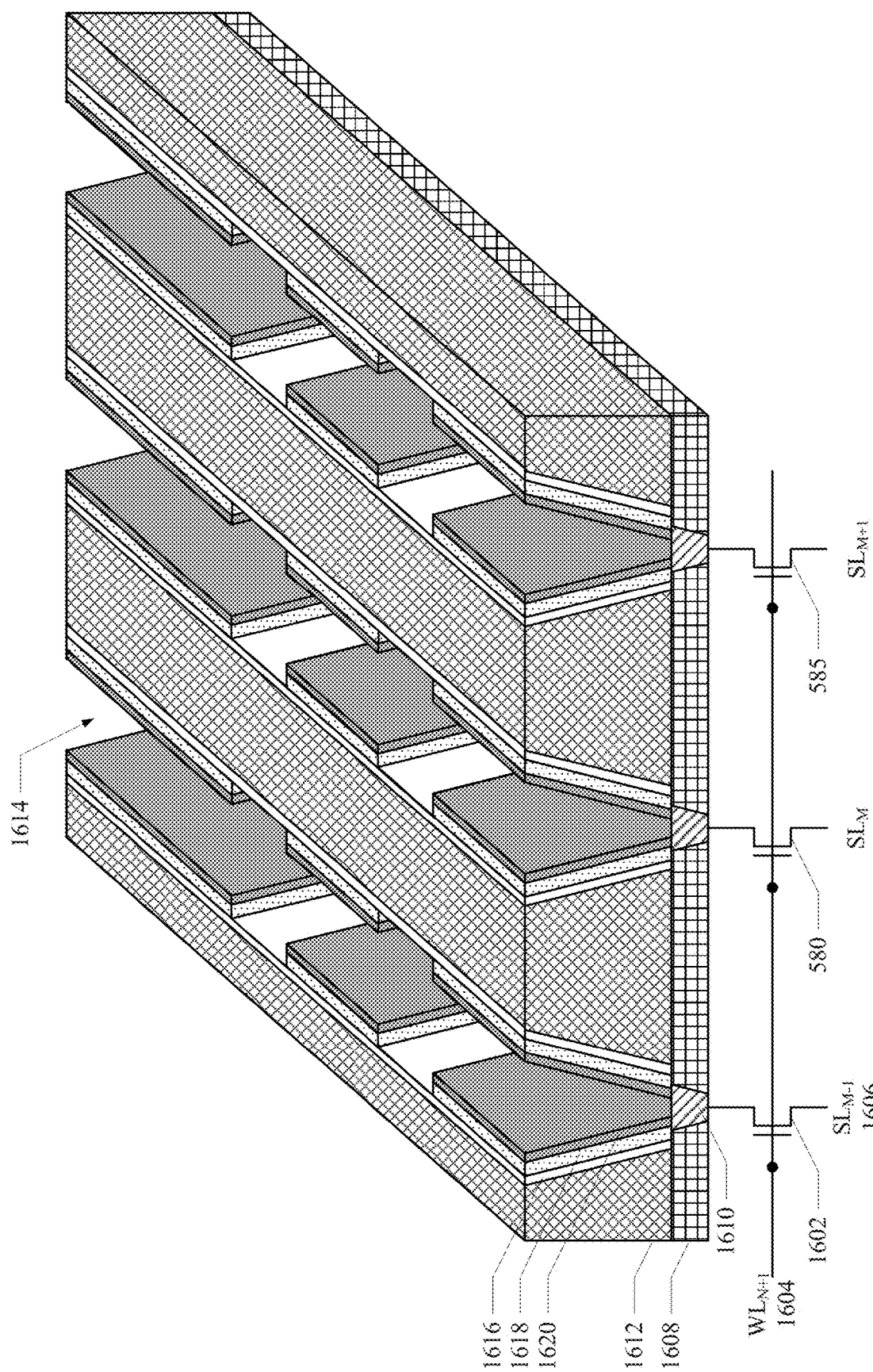

At 1555, one or more portions of the optional non-magnetic layer 1620, one or more portions of the free magnetic layer 1618, and optionally one or more portions of the tunnel insulator layer 1616 can be selectively removed from the walls of the plurality of trenches 1614. In one implementation, an insulator block mask can be formed, and the exposed portions of the optional non-magnetic layer 1620, the free magnetic layer 1618, and optionally the tunnel insulator layer 1616 can be removed by ion beam milling, reactive ion etch or the like. In other implementation, the exposed portions of the optional non-magnetic layer and the free magnetic layer can be oxidized and nitride. In yet another implementation can be ion implanted with Gallium (Ga) or the like. For reference, FIG. 16D illustrates the plurality of portions of the optional non-magnetic layer 1620 and the plurality of portions of the free magnetic layer 1618 without the insulator block mask disposed over them as shown illustrated in the similar structure in FIGS. 14D-14F so that the structure of the formed plurality of portions of the optional non-magnetic layer 1620 and the plurality of portions of the free magnetic layer 1618 can be seen. However, the insulator block mask typically cover the plurality of portions of the optional non-magnetic layer 1620 and the plurality of portions of the free magnetic layer 1618 until after formation of the plurality of insulator blocks formed subsequent processes.

Figure 16E:
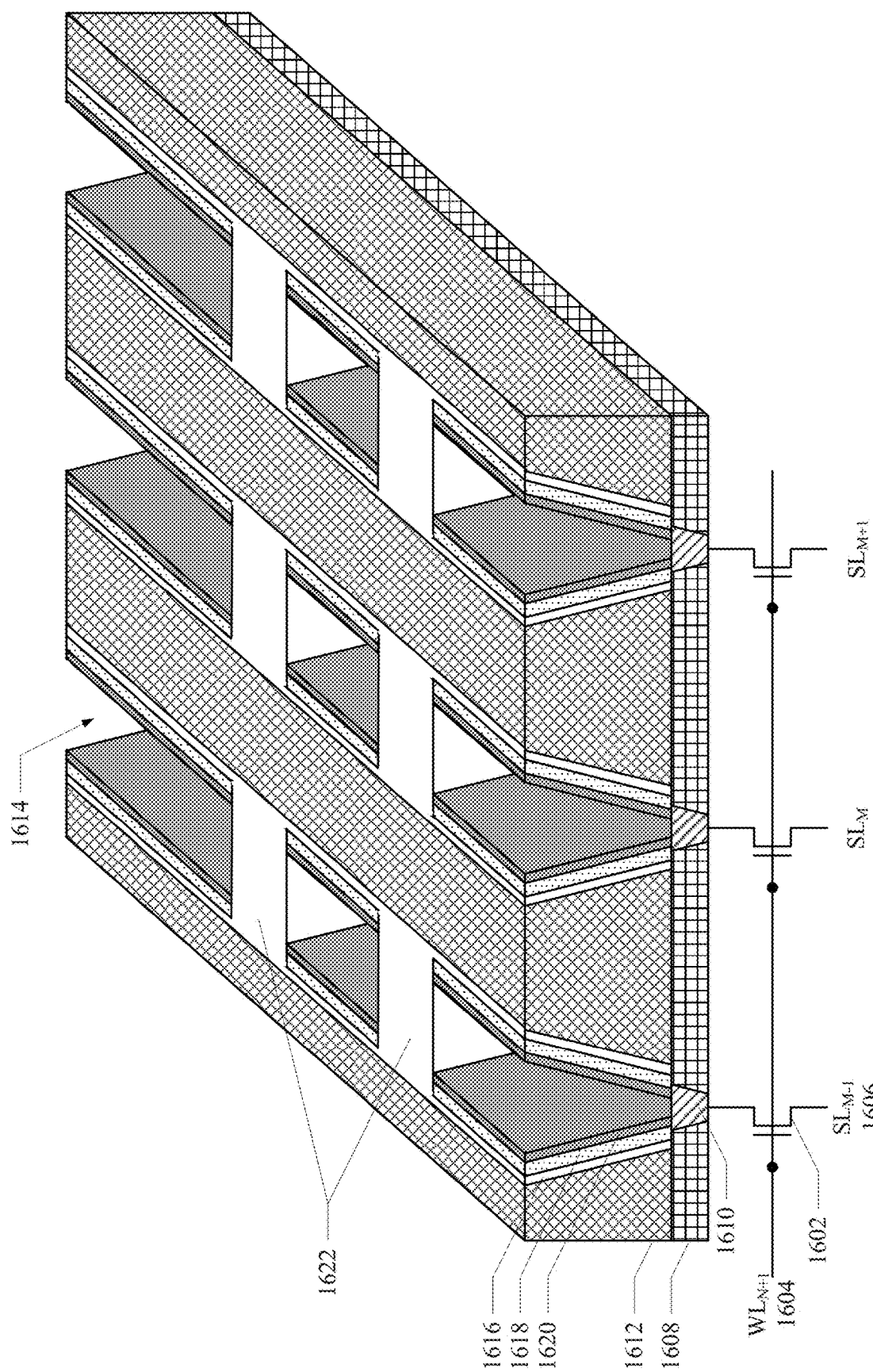

At 1560, a plurality of insulator blocks 1622 can be formed between the plurality of portions of the optional non-magnetic layer 1620, the plurality of portions of the free magnetic layer 1618 and optionally the plurality of portions of the tunnel insulator 1616 in the plurality of trenches 1614 as illustrated in FIG. 16E. In one implementation, one or more layer of an insulator such a Magnesium Oxide (MgO), Silicon Oxide (SiOx), Aluminum Oxide (AlOx), Titanium Oxide (TiOx) or a combination of these oxide materials can be deposited. The one or more insulator layers can be deposited in the portions of the trenches exposed by the insulator block mask and over the surface of the insulator block mask. In one implementation, a processes such as Chemical Mechanical Polishing (CMP) can be used to remove the excess portion of the one or more insulator layers outside the exposed portions of the one or more trenches, and then a resist stripping process can be utilized to remove the insulator block mask.

Figure 16F:
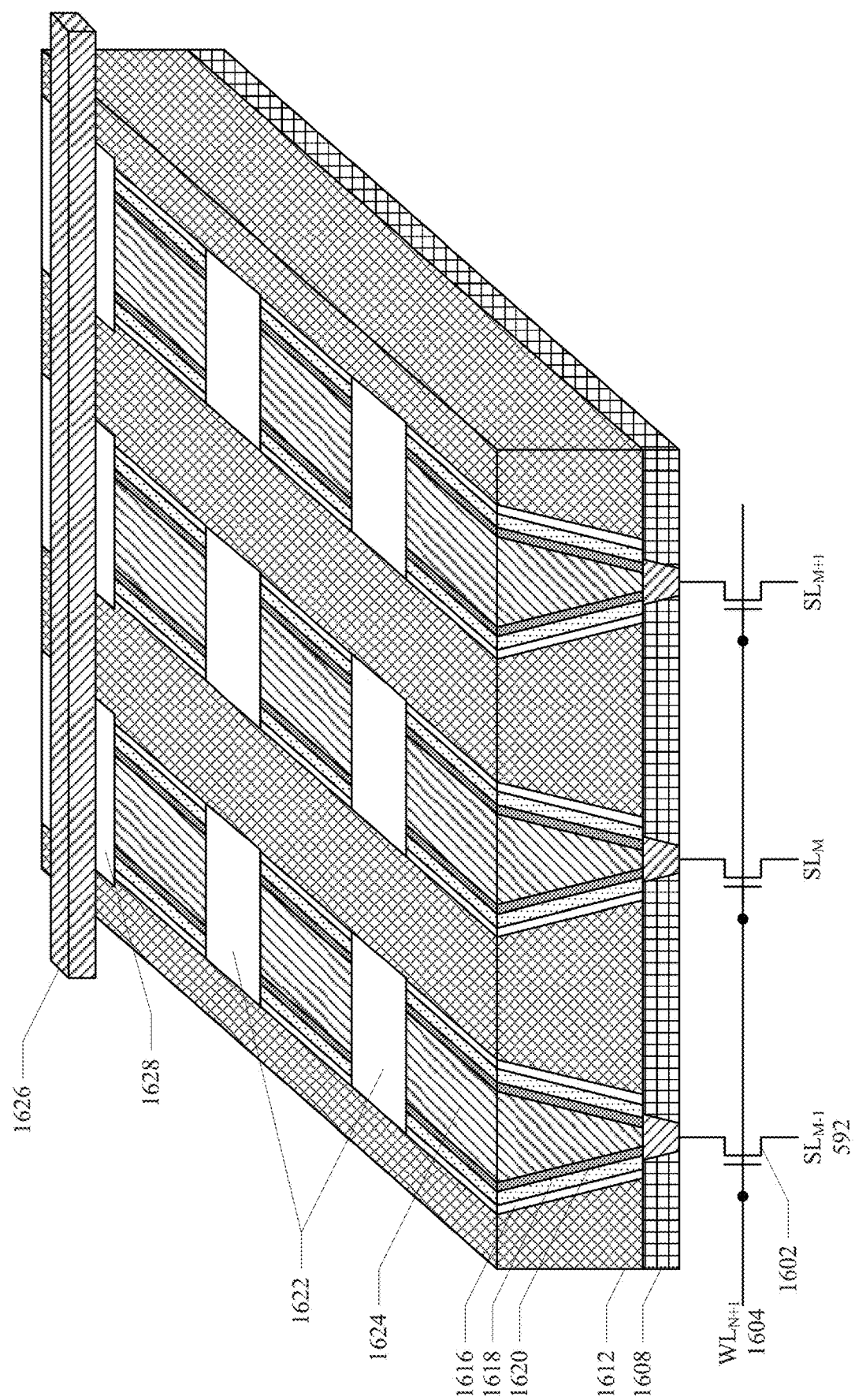

At 1565, a plurality of conductive core 1624 can be formed between the one or more insulator blocks, and between the free magnetic layer or the optional non-magnetic layer if applicable, in the one or more trenches, as illustrated in FIG. 16F. In one implementation a metal seed layer can be deposited on the exposed portions of the free magnetic layer, or the optional non-magnetic layer if applicable, between the one or more insulator blocks. A conductor layer, such as Copper (Cu) can be deposited by a process such as Chemical Vapor Deposition (CVD) on the metal seed layer to form the one or more conductive cores. The processes of 1520 through 1565 can optionally be repeated a plurality of times to form a string of MTJs as illustrated in FIG. 10.

At 1570, portions of one or more planar non-magnetic insulator layers and one or more planar reference magnetic layers can be removed in a periphery region to expose each planar reference magnetic layer. The periphery region can be outside the array of annular openings. In one implementation, a series of one or more etching, milling or the like processes can be used to step down through the planar non-magnetic insulator layers and the planar reference magnetic layers. At 1575, a bit line 1626 can be formed on each planar reference magnetic layer 1612. In one implementation, an insulator layer can be deposited in the periphery region, and a bit line insulator patch mask can be formed from the insulator layer. A selective etching process can be performed to remove the portions of the insulator layer on the free magnetic layer, the optional non-magnetic layer and the conductive core layer in the periphery region exposed by the bit line insulator patch mask to form one or more bit line insulator patches 1628. A conductive layer can be deposited on the reference magnetic layer, while electrically isolated from on the free magnetic layer, the optional non-magnetic layer and the conductive core layer the by the insulator patches. A bit line pattern mask can be formed on the conductive layer and a selective etching process can be performed to remove the portions of the conductive layer exposed by the bit line pattern mask to form the plurality of bit lines on corresponding ones of the planar reference magnetic layers. In another implementation, a photo-resist frame is made by photo process before depositing a bit line material. The photo-resist frame has an opening to form a bit line inside. The electric-plating process is used to form a metal bit line inside the photo-resist frame. After the electrical plating process, the photo-resist frame is removed. The bit lines can be disposed as a plurality of substantially parallel traces in a first direction (e.g., rows) on respective planar reference magnetic layers.

At 1580, one or more bit line vias can optionally be formed. The one or more bit line vias can be coupled to respective bit lines. There are numerous conductive materials that can be utilized for the bit line vias, and there are numerous deposition, masking, and etching process that can be utilized for forming the plurality of bit line vias. The specific materials and processes are not germane to an understanding of aspects of the present technology and therefore will not be described in further detail.

At 1585, one or more global bit lines can be formed. The one or more global bit lines can be coupled to corresponding bit lines or bit line vias, as illustrated in FIG. 7. In one implementation, two or more bit lines arranged in respective columns can be coupled together by a corresponding global bit line. There are numerous conductive materials that can be utilized for the global bit lines, and there are numerous deposition, masking, and etching process that can be utilized for forming the plurality of global bit lines. The specific materials and processes are not germane to an understanding of aspects of the present technology and therefore will not be described in further detail.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A Magnetic Tunnel Junction (MTJ) device comprising:
a reference magnetic layer including one or more trenches within the reference magnetic layer;

a plurality of sections of a tunnel barrier layer disposed on the walls of the one or more trenches within the reference magnetic layer;

a plurality of sections of a free magnetic layer disposed on corresponding sections of the tunnel barrier layer in the one or more trenches within the reference magnetic layer;

a plurality of sections of a conductive layer disposed on corresponding sections of the free magnetic layer in the one or more trenches within the reference magnetic layer; and one or more insulator blocks disposed in the one or more trenches within the reference magnetic layer and between corresponding sections of the tunnel barrier layer, corresponding sections of the free magnetic layer and corresponding sections of the conductive layer in the one or more trenches within the reference magnetic layer.

2. The MTJ of claim 1, further comprising:
one or more sections of a non-magnetic capping layer disposed between the one or more sections of the free magnetic layer and the one or more sections of the conductive layer in the one or more trenches.

3. The MTJ of claim 1, further comprising:
an insulator layer disposed on a first side of the reference magnetic layer; and
one or more interconnects disposed in the insulator layer and coupled to the conductive layer in respective ones of the one or more trenches.

4. The MTJ of claim 1, further comprising:
a first conductive buffer layer disposed on a first side of the reference magnetic layer;
a first insulator layer disposed on the first conductive layer;
a second conductive buffer layer disposed on a second side of the reference magnetic layer; and
a second insulator layer disposed on the second conductive layer.

5. The MTJ of claim 1, further comprising:
one or more bit lines disposed on the reference magnetic layer, across one or more of the insulator blocks and coupled to portions of the reference magnetic layer.

6. The MTJ of claim 1, wherein the one or more trenches have a taper of approximately 10-45 degrees from a second side of the reference magnetic layer to a first side of the reference magnetic layer.

7. The MTJ of claim 1, wherein:
the free magnetic layer includes a Cobalt-Iron-Boron (Co—Fe—B) alloy;
the conductive layer includes one or more of Copper (Cu), copper alloy, Aluminum (Al), aluminum alloy, Ruthenium (Ru) or ruthenium alloy;
the tunnel barrier layer includes one or more of a Magnesium Oxide (MgO), Silicon Oxide (SiOx), Aluminum Oxide (AlOx) or Titanium Oxide (TiOx); and
the reference magnetic layer includes a Cobalt-Iron-Boron (Co—Fe—B) alloy.

8. The MTJ of claim 1, wherein:
a magnetic field of the reference magnetic layer has a fixed polarization substantially parallel to a major planar orientation of the reference magnetic layer; and
a magnetic field of the free magnetic layer has a polarization substantially parallel to the major planar orientation of the reference magnetic layer and selectively switchable between being substantially parallel and substantially antiparallel to the magnetic field of the reference magnetic layer.

9. The MTJ of claim 8, wherein the magnetic field of the free magnetic layer is configured to switch to being substantially parallel to the magnetic field of the reference magnetic layer in response to a current flow in a first direction through the conductive layer and to switch to being substantially anti-parallel to the magnetic field of the reference magnetic layer in response to a current flow in a second direction through the conductive layer.

10. The MTJ of claim 1, wherein:
a magnetic field of the reference magnetic layer has a fixed polarization substantially perpendicular to a major planar orientation of the reference magnetic layer; and
a magnetic field of the free magnetic layer has a polarization substantially perpendicular to the major planar orientation of the reference magnetic layer and selectively switchable between being substantially parallel and substantially antiparallel to the magnetic field of the reference magnetic layer.

11. The MTJ of claim 10, wherein the magnetic field of the free magnetic layer is configured to switch to being substantially parallel to the magnetic field of the reference magnetic layer in response to a current flow in a first direction through the conductive layer and to switch to being substantially anti-parallel to the magnetic field of the reference magnetic layer in response to a current flow in a second direction through the conductive layer.

12. A device comprising:
a reference magnetic layer including a plurality of trenches within the reference magnetic layer;
a plurality of sections of a tunnel barrier layer disposed on the walls of the plurality of trenches within the reference magnetic layer;
a plurality of sections of a free magnetic layer disposed on corresponding sections of the tunnel barrier layer in the plurality of trenches within the reference magnetic layer;
a plurality of sections of a conductive layer disposed on corresponding sections of the free magnetic layer in the plurality of trenches within the reference magnetic layer; and
a plurality of insulator blocks disposed in the plurality of trenches within the reference magnetic layer between corresponding sections of the tunnel barrier layer, corresponding sections of the free magnetic layer and corresponding sections of the conductive layer in an array of columns and rows in the plurality of trenches within the reference magnetic layer.

13. The device of claim 12, wherein the plurality of trenches have a taper of approximately 10-45 degrees from a first side of the reference magnetic layer to a second side of the reference magnetic layer.

14. The device of claim 12, further comprising:
a first set of one or more additional layers disposed a first side of the reference magnetic layer; and
a second set of one or more additional layers disposed on a second side of the reference magnetic layer.

15. The device of claim 12, wherein corresponding sections of the tunnel barrier layer, corresponding section of the free magnetic layer and corresponding sections of the conductive layer disposed between adjacent insulator blocks in one of the plurality of trenches comprise a Magnetic Tunnel Junction (MTJ) cell.

16. The device of claim 12, wherein
a magnetic field of the reference magnetic layer has a fixed polarization substantially parallel to a major planar orientation of the reference magnetic layer; and a magnetic field of the free magnetic layer has a polarization substantially parallel to the major planar orientation of the reference magnetic layer and selectively switchable between being substantially parallel and substantially antiparallel to the magnetic field of the reference magnetic layer.

17. The device of claim 16, wherein the magnetic field of the free magnetic layer is configured to switch to being substantially parallel to the magnetic field of the reference magnetic layer in response to a current flow in a first direction through the conductive layer and to switch to being substantially anti-parallel to the magnetic field of the reference layer magnetic in response to a current flow in a second direction through the conductive layer.

18. The device of claim 12, wherein
a magnetic field of the reference magnetic layer has a fixed polarization substantially perpendicular to a major planar orientation of the reference magnetic layer; and
a magnetic field of the free magnetic layer has a polarization substantially perpendicular to the major planar orientation of the reference magnetic layer and selectively switchable between being substantially parallel and substantially antiparallel to the magnetic field of the reference magnetic layer.

19. The device of claim 18, wherein the magnetic field of the free magnetic layer is configured to switch to being substantially parallel to the magnetic field of the reference magnetic layer in response to a current flow in a first direction through the conductive layer and to switch to being substantially anti-parallel to the magnetic field of the reference layer magnetic in response to a current flow in a second direction through the conductive layer.

20. A memory device comprising:
an array of Magnetic Tunnel Junction (MTJ) cells including;
a reference magnetic layer including a plurality of trenches within the reference magnetic layer;
a plurality of sections of a tunnel barrier layer disposed on the walls of the plurality of trenches within the reference magnetic layer;
a plurality of sections of a free magnetic layer disposed on corresponding sections of the tunnel barrier layer in the plurality of trenches within the reference magnetic layer;
a plurality of sections of a conductive layer disposed in the plurality of trenches within the reference magnetic layer on corresponding sections of the free magnetic layer in the plurality of trenches within the reference magnetic layer;
a plurality of insulator blocks disposed in the plurality of trenches within the reference magnetic layer between corresponding sections of the tunnel barrier layer, corresponding sections of the free magnetic layer and corresponding sections of the conductive layer in an array of columns and rows in the plurality of trenches within the reference magnetic layer;
a bit line coupled to the reference magnetic layer; and
a plurality of select transistors, each select transistor coupled to respective sections of the conductive layer in the plurality of trenches.

21. The memory device of claim 20, further comprising:
a plurality of word lines, each word line coupled to gates of a set of the plurality of select transistors arranged in a corresponding row; and
a plurality of source lines, each source line coupled to sources of a set of the plurality of select transistors arranged in a corresponding column.

22. The memory device of claim 20, further comprising:
a plurality of blocks of the array of MTJ cells arranged in columns and rows.

23. The memory device of claim 22, further comprising:
a plurality of global bit lines, each global bit line coupled to a set of bit lines in a corresponding column of the plurality of blocks of the array of MTJ cells.

24. The memory device of claim 20, wherein
a magnetic field of the reference magnetic layer has a fixed polarization substantially parallel to a major planar orientation of the reference magnetic layer; and
a magnetic field of the free magnetic layer has a polarization substantially parallel to the major planar orientation of the reference magnetic layer and selectively switchable between being substantially parallel and substantially antiparallel to the magnetic field of the reference magnetic layer.

25. The memory device of claim 24, wherein the magnetic field of the free magnetic layer is configured to switch to being substantially parallel to the magnetic field of the reference magnetic layer in response to a current flow in a first direction through the conductive layer and to switch to being substantially anti-parallel to the magnetic field of the reference magnetic layer in response to a current flow in a second direction through the conductive layer.

26. The memory device of claim 20, wherein
a magnetic field of the reference magnetic layer has a fixed polarization substantially perpendicular to a major planar orientation of the reference magnetic layer; and
a magnetic field of the fee magnetic layer has a polarization substantially perpendicular to the major planar orientation of the reference magnetic layer and selectively switchable between being substantially parallel and substantially antiparallel to the magnetic field of the reference magnetic layer.

27. The memory device of claim 26, wherein the magnetic field of the free magnetic layer is configured to switch to being substantially parallel to the magnetic field of the reference magnetic layer in response to a current flow in a first direction through the conductive layer and to switch to being substantially anti-parallel to the magnetic field of the reference magnetic layer in response to a current flow in a second direction through the conductive layer.

* * * * *